(12) United States Patent
Kiyotoshi

(10) Patent No.: US 8,143,146 B2
(45) Date of Patent: Mar. 27, 2012

(54) METHOD FOR MANUFACTURING A NONVOLATILE STORAGE DEVICE

(75) Inventor: Masahiro Kiyotoshi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 12/469,872

(22) Filed: May 21, 2009

(65) Prior Publication Data

US 2009/0294751 A1 Dec. 3, 2009

(30) Foreign Application Priority Data

May 29, 2008 (JP) ................................ 2008-140749

(51) Int. Cl.
*H01L 21/20* (2006.01)
*H01L 21/36* (2006.01)

(52) U.S. Cl. .......................................... 438/482; 257/4

(58) Field of Classification Search ........ 257/4, E21.091, 257/E45.002; 438/482
See application file for complete search history.

(56) References Cited

U.S. PATENT DOCUMENTS

| | | | |
|---|---|---|---|
| 6,413,805 B1 | 7/2002 | Zhang et al. | |
| 6,541,316 B2 | 4/2003 | Toet et al. | |
| 7,046,545 B2 * | 5/2006 | Hosotani | 365/158 |
| 7,205,564 B2 * | 4/2007 | Kajiyama | 257/40 |
| 7,425,724 B2 * | 9/2008 | Aratani et al. | 257/68 |
| 2004/0180477 A1 * | 9/2004 | Zhang et al. | 438/149 |
| 2008/0026547 A1 | 1/2008 | Yin et al. | |
| 2008/0073635 A1 | 3/2008 | Kiyotoshi et al. | |
| 2008/0105878 A1 * | 5/2008 | Ohara | 257/74 |

FOREIGN PATENT DOCUMENTS

JP 2008-34809 2/2008

* cited by examiner

*Primary Examiner* — Phuc Dang
(74) *Attorney, Agent, or Firm* — Finnegan, Henderson, Farabow, Garrett & Dunner, L.L.P.

(57) ABSTRACT

A method for manufacturing a nonvolatile storage device with a plurality of unit memory layers stacked therein is provided. Each of the unit memory layers includes: a first interconnect extending in a first direction; a second interconnect extending in a second direction; a recording unit sandwiched between the first and second interconnects and being capable of reversibly transitioning between a first state and a second state in response to a current supplied through the first and second interconnects; and a rectifying element sandwiched between the first interconnect and the recording unit and including at least one of p-type and n-type impurities. In the method, the first interconnect, the second interconnect, the recording unit, and a layer of an amorphous material including the at least one of p-type and n-type impurities used in the plurality of unit memory layers are formed at a temperature lower than a temperature at which the amorphous material is substantially crystallized. The amorphous material used in the plurality of unit memory layers is simultaneously crystallized and the impurities included in the amorphous material used in the plurality of unit memory layers are simultaneously activated.

15 Claims, 17 Drawing Sheets

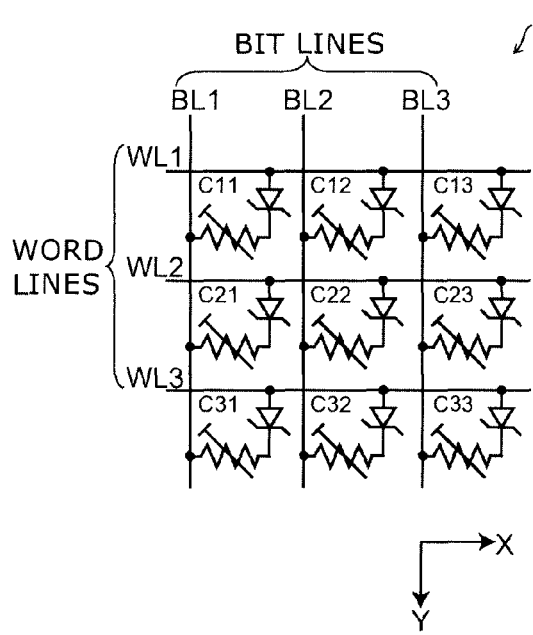
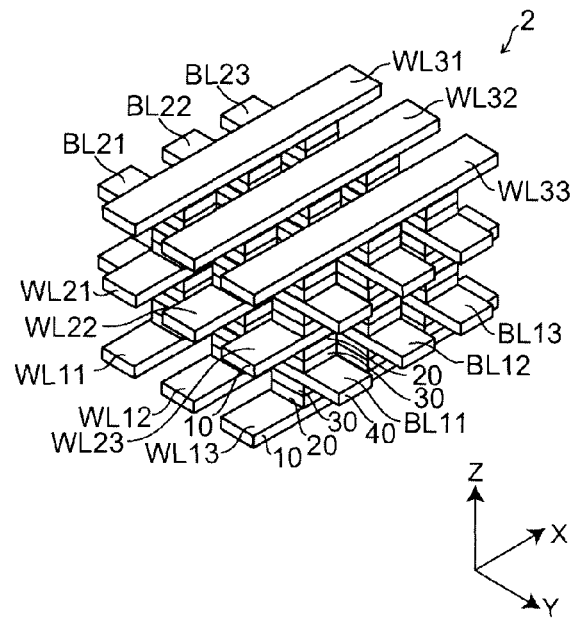
FIG. 1A
FIG. 1B
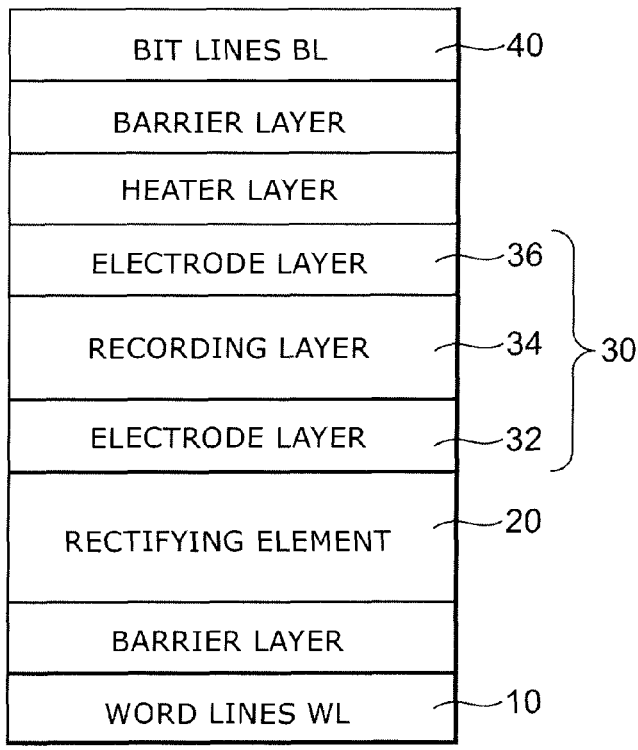
FIG. 2

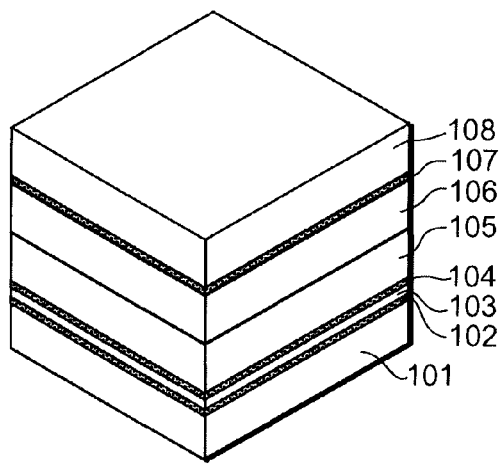
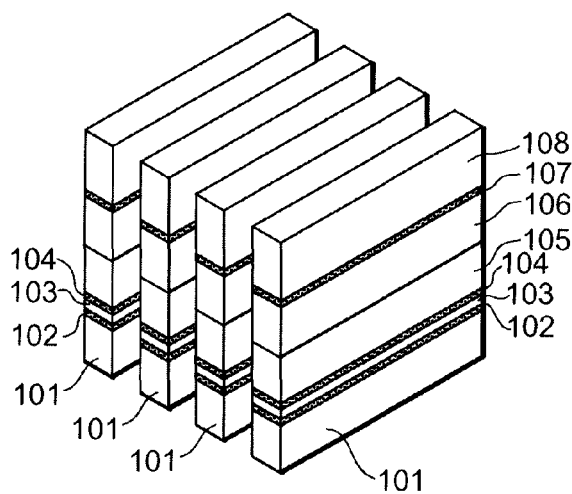
FIG. 9A    FIG. 9B
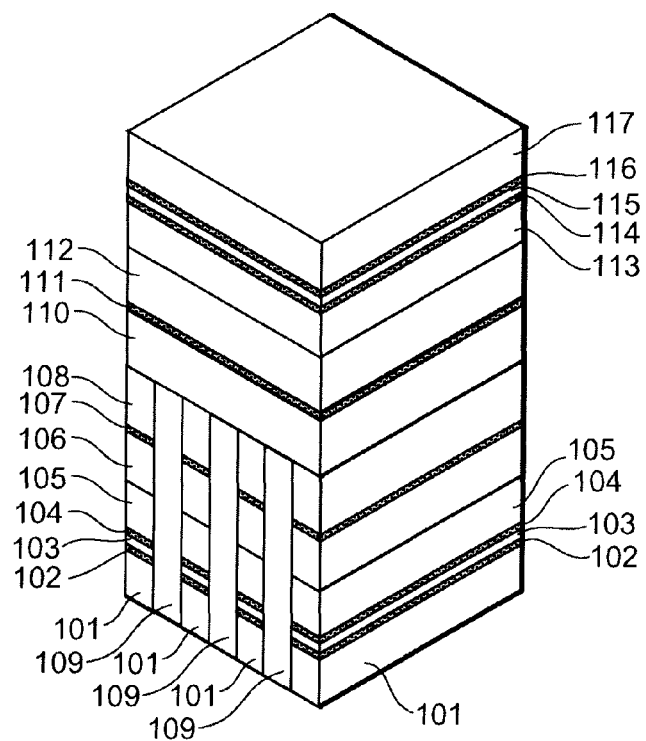
FIG. 9C

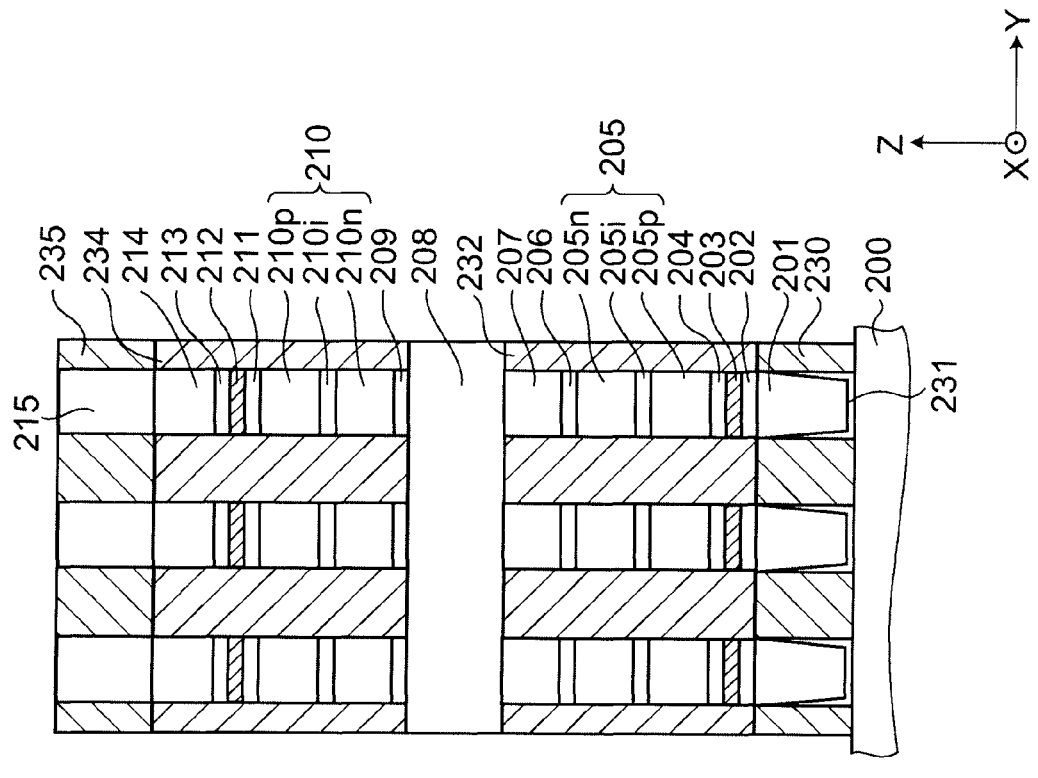
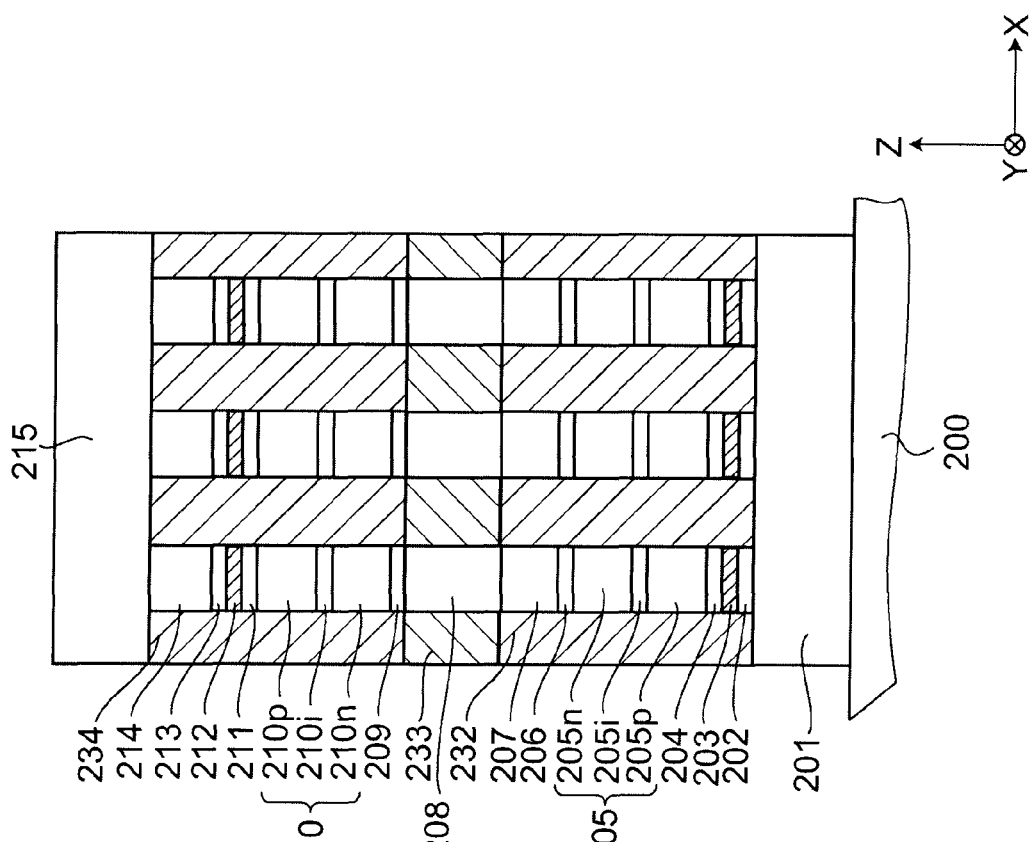
FIG. 18A
FIG. 18B

METHOD FOR MANUFACTURING A NONVOLATILE STORAGE DEVICE

CROSS-REFERENCE TO RELATED APPLICATIONS

This application is based upon and claims the benefits of priority from the prior Japanese Patent Application No. 2008-140749, filed on May 29, 2008; the entire contents of which are incorporated herein by reference.

BACKGROUND OF THE INVENTION

1. Field of the Invention

This invention relates to a nonvolatile storage device with a plurality of unit nonvolatile storage devices layered therein and a method for manufacturing the same.

2. Background Art

Nonvolatile memories, such as NAND flash memories, are widely used as high-capacity data storage in, e.g., cellular phones, digital still cameras, USB (Universal Serial Bus) memories, and silicon audio players, and continuing to expand the market as the manufacturing cost per bit is reduced by rapid downscaling. Furthermore, novel applications have also been fast emerging, achieving a virtuous circle in which downscaling and manufacturing cost reduction find new markets.

In particular, a NAND flash memory substantially realizes cross-point cells by allowing a plurality of active areas (AA) to share a gate conductor (GC), and is being rapidly downscaled because of its simple structure. Hence, recently, NAND flash memories have led semiconductor scaling, and the minimum processing dimension has reached 50 nm or less even in mass production However, a NAND flash memory is based on the operation of a transistor which records information using its threshold voltage variation, and reportedly has limitations on further improvement of its characteristics uniformity, reliability, operating speed, and bit density. Thus, development of new nonvolatile memories is desired.

In this context, for example, phase change memory elements and resistance change elements are operated using the variable resistance of resistance materials, and hence need no transistor operation for program/erase operation. Furthermore, the device characteristics are improved as the resistance material is downsized. Thus, they are promising for realizing higher characteristics uniformity, reliability, operating speed, and integration density to meet future requirements.

Phase change memories and resistance change memories have an advantage of being easily downscaled because a plurality of memory layers can be stacked, and several memory elements having such configuration have been proposed. In these memories, unlike NAND flash memories, sensing is based on the amount of current. Hence, in phase change memories and resistance change memories, in order to avoid the sneak current during recording/reproduction, each memory cell is often provided with a rectifying element, such as a diode, for regulating the direction of current, and several manufacturing methods therefore have been proposed (e.g., JP-A-2008-034809).

SUMMARY OF THE INVENTION

According to an aspect of the invention, there is provided a method for manufacturing a nonvolatile storage device with a plurality of unit memory layers layered therein, each of the unit memory layers including: a first interconnect aligned in a first direction; a second interconnect aligned in a second direction that is non-parallel to the first direction; a recording unit disposed between the first interconnect and the second interconnect and being capable of reversibly transitioning between a first state and a second state in response to a current supplied through the first interconnect and the second interconnect; and a rectifying element disposed between the first interconnect and the recording unit and including at least one of p-type and n-type impurities, the method including: forming the first interconnect, the second interconnect, the recording unit, and a layer of an amorphous material including the at least one of p-type and n-type impurities used in the plurality of unit memory layers, at a temperature lower than a temperature at which the amorphous material is substantially crystallized; simultaneously crystallizing the amorphous material used in the plurality of unit memory layers; and simultaneously activating the impurities included in the amorphous material used in the plurality of unit memory layers.

According to another aspect of the invention, there is provided a nonvolatile storage device with a plurality of unit memory layers layered therein, each of the unit memory layers including: a first interconnect aligned in a first direction; a second interconnect aligned in a second direction that is non-parallel to the first direction; a recording unit provided between the first interconnect and the second interconnect; and a rectifying element provided between the first interconnect and the recording unit, the rectifying element including at least one of p-type and n-type impurities, and concentration distribution of the impurities and crystallinity in the rectifying element being generally the same across the rectifying elements of the plurality of unit memory layers.

BRIEF DESCRIPTION OF THE DRAWINGS

FIGS. 1A and 1B are schematic views illustrating the configuration of a nonvolatile storage device 2 according to Example 1;

FIG. 2 is a schematic cross-sectional view illustrating the configuration of a unit memory layer 2A of the nonvolatile storage device 2 according to Example 1;

FIGS. 9A to 12 are schematic process perspective views illustrating the method for manufacturing the nonvolatile storage device 2P according to Practical example 1;

FIGS. 15A to 18B are schematic process cross-sectional views illustrating the method for manufacturing the nonvolatile storage device 2Q according to Practical example 2.

DETAILED DESCRIPTION OF THE INVENTION

Figure 3A:
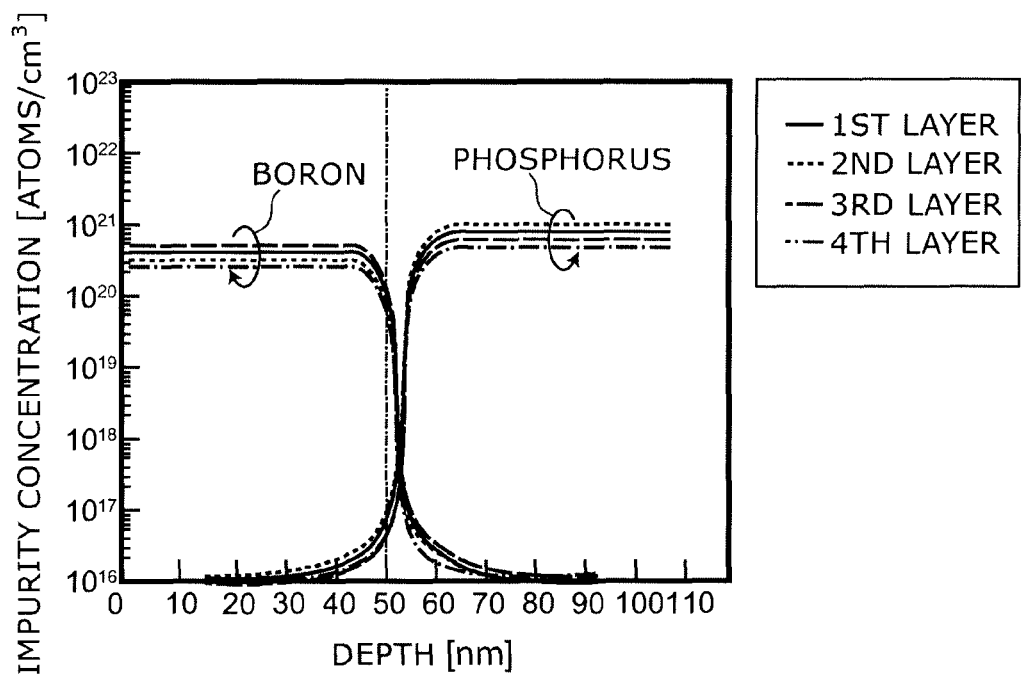
FIGS. 3A and 3B are graphs for illustrating the concentration distribution of impurities in the rectifying element 20.

An embodiment of the invention will now be described with reference to the drawings. In the specification and the drawings, like components are labeled with like reference numerals, and the detailed description thereof is omitted as appropriate.

First, an example (Example 1) of the nonvolatile storage device according to the embodiment of the invention is described with reference to FIGS. 1A to 3B.

FIGS. 1A and 1B are schematic views illustrating the configuration of a nonvolatile storage device 2 according to Example 1. More specifically, FIG. 1A is a schematic circuit diagram of the nonvolatile storage device 2, and FIG. 1B is a schematic perspective view of the nonvolatile storage device 2. Here, FIG. 1A illustrates the circuit configuration of a unit nonvolatile storage device, which is one layer in the nonvolatile storage device 2.

FIG. 2 is a schematic cross-sectional view illustrating the configuration of a unit memory layer 2A of the nonvolatile storage device 2 according to Example 1.

As shown in FIGS. 1A to 2, the nonvolatile storage device 2 of Example 1 includes a plurality of unit memory layers 2A, each including first interconnects (word lines) 10 extending in a first direction (X-axis direction), second interconnects (bit lines) 40 extending in a second direction (Y-axis direction) that is non-parallel to the first direction, a recording unit 30 (including a variable resistance element, that is, a recording layer 34) sandwiched between the first interconnect 10 and the second interconnect 40 and being capable of reversibly transitioning between a first state and a second state in response to a voltage applied through the first interconnect 10 and the second interconnect 40, and a rectifying element 20 (control diode) sandwiched between the first interconnect 10 and the recording unit 30, the unit memory layers 2A being layered in the layering direction of the first interconnect 10, the rectifying element 20, the recording unit 30 and the like (vertical or Z-axis direction in FIG. 1B). Here, as described later, the rectifying element 20 includes p-type and/or n-type impurities, and the concentration distribution of the impurities in the rectifying element 20 is generally the same across the plurality of unit memory layers 2A.

One recording unit 30 provided at the intersection of one first interconnect 10 and one second interconnect 40 serves as one storage unit element, referred to as "cell". As shown in FIG. 1A, the nonvolatile storage device 2 includes cells C11, C12, C13, C21, C22, C23, C31, C32, and C33 at intersections of the first interconnects 10 (word lines WL) and the second interconnects 40 (bit lines BL).

The voltage applied to each recording unit 30 depends on the combination of potentials applied to the first interconnect 10 and the second interconnect 40, and the characteristics (such as resistance) of the recording unit 30 (recording layer 36) associated with the voltage can be used to record or erase information. It is noted that an inter-element dielectric layer, not shown, is provided between the cells.

Furthermore, a contact plug, not shown, can be provided outside the extending direction of the interconnects L (word line WL and bit line BL) with reference to the position of the cell. The contact plug is connected to a peripheral circuit, such as a read/program circuit for programming and reading data (not shown). A voltage is applied to the recording unit 30 through the contact plug and the interconnects L (word line WL and bit line BL) and enables various operations of the recording unit 30, such as program and erase operation.

Thus, the nonvolatile storage device 2 is a so-called multilayer cross-point nonvolatile storage device (memory) with a plurality of nonvolatile storage devices layered therein, where a recording unit 30 (recording layer 36) is provided at the intersection of the word line WL and the bit line BL.

In FIGS. 1A and 1B, four unit memory layers 2A are vertically layered, but a different number of layers may be layered. Furthermore, in FIGS. 1A and 1B, in the major surface, three first interconnects 10 and three second interconnects 40 are provided, and nine cells are provided. However, a different number of interconnects and cells may be provided. Here, the "major surface" refers to the surface (XY plane in the figure) perpendicular to the layering direction (vertical direction in the figure) of the first interconnect 10, the rectifying element 20, the recording unit 30 and the like.

In Example 1, the first interconnect is used as a "bit line BL", and the second interconnect is used as a "word line WL". However, conversely, the first interconnect may be used as a "word line WL", and the second interconnect may be used as a "bit line BL".

In Example 1, the layout of the components of the unit memory layer 2A (the first interconnects 10, the rectifying elements 20, the recording units 30, and the second interconnects 40) is vertically symmetric with respect to that of the vertically adjacent unit memory layer 2A. However, it is possible to use another layout. For example, the vertical layout of the components may be the same in a plurality of unit memory layers 2A. It is also possible to use other layouts.

The nonvolatile storage device 2 according to Example 1 has a so-called shared word line/bit line structure in which the first interconnect 10 (word line WL) or the second interconnect 40 (bit line BL) is shared between vertically adjacent unit memory layers 2A. However, it is possible to use a structure without such sharing.

In Example 1, the interconnects of the same kind, that is, the word lines WL, are located at both vertical ends of the nonvolatile storage device 2. However, the interconnects of different kinds (word lines WL and bit lines BL) may be located thereat.

Next, each component is described.

First, the interconnect L (first interconnect 10 and second interconnect 40) is described.

The interconnect L can be made of a conductive material, for example, a metal, such as tungsten (W), or tungsten compounds, such as tungsten nitride and tungsten carbide. The material of the interconnect L is further described later.

As shown in FIG. 2, the recording unit 30 includes a recording layer 34, and electrode layers 32 and 36 vertically sandwiching the recording layer 34.

The electrode layers 32 and 36 are provided for electrical connection to the recording layer 34. The electrode layers 32 and 36 may also serve, for example, as barrier layers for preventing elemental diffusion and the like between the recording layer 34 and the vertically adjacent components.

To efficiently heat the recording layer 34 in reset (erase) operation, a heater layer may be provided on the cathode side (here, on the bit line BL side) of the recording layer 34. In this case, a barrier layer may be provided between the heater layer and the bit line BL.

The electrode layers 32 and 36, the barrier layer, and the heater layer are provided as needed, and can be omitted.

Next, the recording layer 34 is described.

As described above, in the nonvolatile storage device 2 according to this Example, the voltage applied to each recording unit 30 depends on the combination of potentials applied to the first interconnect 10 and the second interconnect 40, and the characteristics (such as resistance) of the recording unit 30 to which the bias voltage is applied can be used to record or erase information. Hence, the recording layer 34 can be made of any material having characteristics varied with the applied voltage. For example, the recording layer 34 can be a phase change layer capable of reversibly transitioning between the crystalline state and the amorphous state in response to the applied voltage, or a variable resistance layer capable of reversibly transitioning between different resistances.

Specific examples of such materials include variable resistance materials based on chalcogenides (compounds containing group VIB elements such as Se and Te) which change between the crystalline state and the amorphous state in response to the applied voltage. The material used for the recording layer 34 is further described later.

Next, the rectifying element 20 is described.

The rectifying element 20 has rectifying characteristics and is provided to impart directionality to the polarity of the voltage applied to the recording layer 34.

The first interconnect 10 (word line WL) and the second interconnect 40 (bit line BL) are independent of each other without direct connection therebetween. However, one first interconnect 10 may be electrically connected to any of the first interconnects 10 and the second interconnects 40 through cells. Hence, to enable any cell to be selected by a combination of the first interconnect 10 and the second interconnect 40, an element having rectifying characteristics needs to be provided between the interconnect L and the recording unit 30 (variable resistance element) to regulate the direction of current. Thus, each memory cell is provided with a rectifying element 20.

The rectifying element 20 can be a Zener diode, a PN junction diode, or a Schottky diode. In this embodiment, the rectifying element 20 includes p-type and/or n-type impurities, and as described in detail later with reference to FIGS. 3A and 3B, the concentration distribution of the impurities in the rectifying element 20 is generally the same across the plurality of unit memory layers 2A.

Between the first interconnect 10 and the rectifying element 20, a barrier layer for preventing elemental diffusion therebetween may be provided.

It is noted that the rectifying element 20 may extend outside the region where the word line WL and the bit line BL are opposed to each other.

In this Example, as described earlier, the first interconnects 10 (word lines WL in this example) and the second interconnects 40 (bit lines BL in this example) are interchangeable. Hence, the stacking order of the layers constituting the multilayer structure of the unit memory layer 2A illustrated in FIG. 2 can be permuted as long as technically feasible. For example, in the unit memory layer 2A illustrated in FIG. 2, the rectifying element 20 can be permuted with the heater layer, the electrode layer 36, the recording layer 34, and the electrode layer 32, so that the rectifying element is located on the bit line BL side, and the heater layer, the electrode layer 36, the recording layer 34, and the electrode layer 32 are located on the word line WL side. Various other modifications are also possible.

Next, the concentration distribution of impurities in the rectifying element 20 is described with reference to FIGS. 3A and 3B.

Figure 3B:
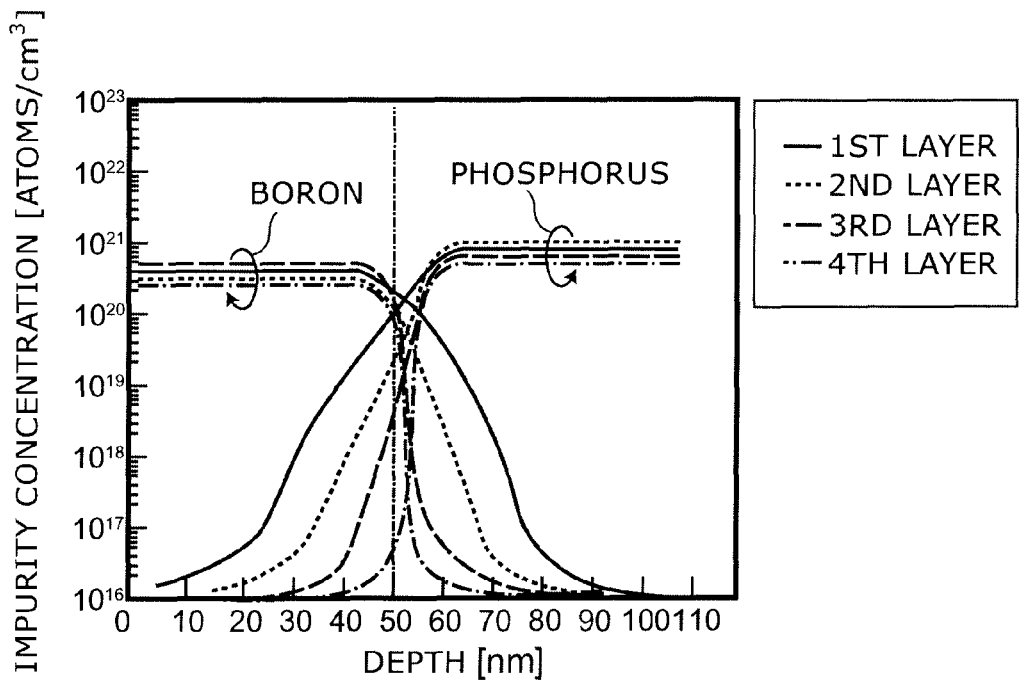

FIGS. 3A and 3B are graphs for illustrating the concentration profile of impurities in the rectifying element 20. More specifically, FIG. 3A is a schematic graph showing the depthwise impurity concentration in the rectifying element 20 of each layer in Example 1. FIG. 3B is a schematic graph showing the depthwise impurity concentration in the rectifying element 20 of each layer in a comparative example as contrasted with this embodiment. Here, the nonvolatile storage device according to the comparative example is different from the nonvolatile storage device 2 according to Example 1 in the impurity concentration profile of the rectifying element 20 as described below. The rest of the configuration is the same as that of the nonvolatile storage device 2 according to Example 1.

The rectifying element 20 of Example 1 and the comparative example as shown in FIGS. 3A and 3B is a PN junction diode. The p-type semiconductor is amorphous silicon doped with B (boron), and the n-type semiconductor is amorphous silicon doped with P (phosphorus).

In Example 1 with the characteristics illustrated in FIG. 3A, the rectifying elements 20 of the first to fourth layers are simultaneously crystallized and impurity (p-type impurity, boron, and n-type impurity, phosphorus) activated. That is, these rectifying elements 20 are simultaneously subjected to heat treatment for crystallization and heat treatment for impurity activation. Thus, the rectifying element 20 of each layer undergoes the same thermal budget.

On the other hand, in the comparative example with the characteristics illustrated in FIG. 3B, the rectifying element 20 of the first layer is first subjected to heat treatment for crystallization and impurity activation, and then the rectifying elements 20 of the upper layers are sequentially subjected to heat treatment for crystallization and impurity activation. Here, when the rectifying element 20 of the upper layer is heat treated, the rectifying element 20 of the lower layer is also simultaneously heat treated. That is, the rectifying element 20 of the lower layer undergoes higher thermal budget.

Here, crystallization was performed by heat treatment in a diffusion furnace at 540-620° C. for several to several ten hours. Impurity activation was performed by annealing at 1000° C. for 10 seconds using RTP (rapid thermal process).

As a result of such difference in the manufacturing process, the impurity concentration profile of Example 1 is different from the impurity concentration profile of the comparative example as shown in FIGS. 3A and 3B.

As shown in FIG. 3A, in the nonvolatile storage device 2 according to Example 1, the depthwise impurity concentration profile of the rectifying element 20 of each layer is generally the same. In all the four layers, at 52-53 nm, the boron concentration steeply decreases, whereas conversely, the phosphorus concentration steeply increases. Thus, according to this embodiment, by the aforementioned process for fabricating the rectifying element 20, the impurity concentration profile of the rectifying element 20 is generally the same across the plurality of unit memory layers 2A.

On the other hand, as shown in FIG. 3B, in the nonvolatile storage device according to the comparative example, the depthwise impurity concentration profile of the rectifying element 20 differs between layers. In the fourth layer, at 52-53 nm, the boron concentration steeply decreases, whereas conversely, the phosphorus concentration steeply increases. However, the depthwise concentration distribution is more gradual in the lower layer. That is, the rectifying element 20 of the lower layer undergoes more thermal budget. This varies the impurity concentration profile, and the degree of variation is more significant in the lower layer.

Although FIGS. 3A and 3B show the depthwise concentration distribution at an arbitrary point on the major surface by way of example, it is considered that a similar concentration distribution is exhibited at other points on the major surface. That is, in the nonvolatile storage device 2 according to this embodiment, the impurity concentration profile of the rectifying element 20 is generally the same in a three-dimensional manner across the plurality of unit memory layers 2A. More specifically, the average of impurity concentrations at a plurality of points in each of the unit memory layers 2A is generally the same as the average of impurity concentrations at a plurality of points in a different one of the unit memory layers 2A.

In contrast, in the nonvolatile storage device according to the comparative example, the average of impurity concentrations at a plurality of points in each of the unit memory layers 2A is different from the average of impurity concentrations at a plurality of points in a different one of the unit memory layers 2A. That is, in the nonvolatile storage device according to the comparative example, the impurity concentration profile of the rectifying element 20 is different in a three-dimensional manner across the plurality of unit memory layers 2A.

TABLE 1 shows a result of TEM (transmission electron microscopy) characterization of the average grain size of polycrystalline silicon in each layer of FIGS. 3A and 3B. As seen in TABLE 1, the comparative example of FIG. 3B has a broader distribution in crystal grain size than the Example of FIG. 3A. That is, in the nonvolatile storage device according to the comparative example, the crystallinity of the rectifying element 20 is different in a three-dimensional manner across the plurality of unit memory layers 2A.

TABLE 1

Average grain size of polycrystalline silicon

| | Example 1 (FIG. 3A) | | Comparative example (FIG. 3B) | |
| --- | --- | --- | --- | --- |
| | Average grain size [nm] | σ [nm] | Average grain size [nm] | σ [nm] |
| 1st layer | 23.5 | 2.1 | 48 | 8.6 |
| 2nd layer | 22.8 | 2.3 | 33 | 4.5 |
| 3rd layer | 24.1 | 2.5 | 28 | 2.7 |
| 4th layer | 23.2 | 2.2 | 23 | 2.2 |

Effect of This Embodiment

Next, the effect of this embodiment is described.

The nonvolatile storage device 2 according to Example 1 has the effects of (1) being easily processed and (2) achieving good operating characteristics. In the following, these effects are each described by contrast with the comparative example.

First, the effect of (1) being easily processed is described.

As described above, in the comparative example, heat treatment for crystallization and impurity activation is performed on the rectifying element 20 for each layer.

In contrast, in this embodiment, the rectifying elements 20 are simultaneously subjected to crystallization and impurity activation. Hence, the nonvolatile storage device 2 according to this embodiment requires a relatively small number of steps for forming the rectifying elements 20, and is more easily processed than the nonvolatile storage device according to the comparative example.

Next, the effect of (2) achieving good operating characteristics is described.

In general, the characteristics of a PN junction diode depend on the impurity profile (impurity concentration profile, i.e., how impurities are diffused) in the p-type semiconductor and the n-type semiconductor, and the crystallinity of polycrystalline silicon.

In the comparative example described above, the diode of the lower layer undergoes the thermal budget of the process for manufacturing the diode of the upper layer, and the impurity profile is varied by impurity diffusion each time a memory layer is layered. Thus, the impurity concentration profile and crystallinity of the PN junction diode differ between the layers. Hence, it is relatively difficult to allow the diode characteristics to be made uniform across the layers. As a result, unfortunately, the layered memory cells are likely to have different cell characteristics between the layers.

In contrast, in this embodiment, the impurity concentration profile of the PN junction diode is uniform (generally the same) across the layers, and crystallinity is also uniform. Hence, the diode characteristics are relatively uniform across the layers. This provides uniform cell characteristics across the layers, achieving good operating characteristics.

Thus, this embodiment (Example 1) can provide a nonvolatile storage device achieving good operating characteristics and being easily processed, where the method for manufacturing memory cells is designed so that the thermal process determining the diode characteristics is simultaneously performed after all the memory cells are layered to provide uniform cell characteristics across the layers.

According to this embodiment, by layering a larger number of resistance change memories, the integration density of a nonvolatile storage device can be increased. Thus, the application area of nonvolatile storage devices is expected to further expand in the future.

Method for Manufacturing a Nonvolatile Storage Device

Next, a method for manufacturing a nonvolatile storage device according to this embodiment is described with reference to FIGS. 4A to 8B.

The method for manufacturing a nonvolatile storage device is described below in the case where two unit memory layers 2A are layered.

The manufacturing method according to this embodiment begins with forming various components used in a plurality of unit memory layers 2A, such as the first interconnect 10, the second interconnect 40, the recording unit 30, and a material layer of the rectifying element 20 (rectifying element material layer 22). Here, the rectifying element material layer 22 includes an amorphous material (such as an amorphous semiconductor) and p-type and/or n-type impurities. These various components are formed at a temperature lower than the temperature at which the amorphous material of the rectifying element material layer 22 is crystallized.

Subsequently, the amorphous material of the rectifying element material layers 22 used in the plurality of unit memory layers 2A is simultaneously crystallized. Further subsequently, the p-type and/or n-type impurities in the rectifying element material layers 22 used in the plurality of unit memory layers 2A are simultaneously activated.

In the following, an example of the method for manufacturing a nonvolatile storage device according to this embodiment (Example manufacturing method 1) is described with reference to FIGS. 4A to 5C.

FIGS. 4A to 5C are schematic process cross-sectional views showing Example manufacturing method 1. This Example manufacturing method manufactures a two-layer cross-point nonvolatile storage device 2 having uniform cell characteristics across the layers.

Figure 4A:
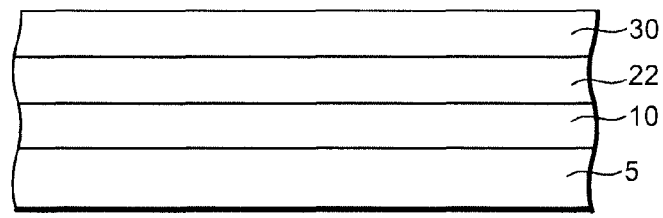
FIGS. 4A to 5C are schematic process cross-sectional views showing Example manufacturing method 1.

First, as shown in FIG. 4A, on the major surface of a substrate 5, the layers of a first interconnect 10, a rectifying element material layer 22, and a recording unit 30 are formed in this order from bottom. These layers can be formed illustratively by a sputtering method such as room-temperature DC sputtering. Such processing at a relatively low temperature can avoid crystallization of the amorphous material of the rectifying element material layer 22. The rectifying element material layer 22 can be a multilayer structure of various n-type semiconductor layers and p-type semiconductor layers.

Figure 4B:
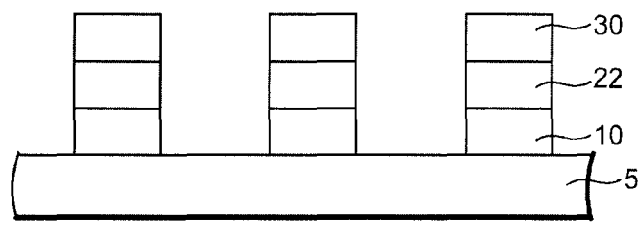

Next, as shown in FIG. 4B, a suitable etching mask is provided by photolithography on the above multilayered structure, and by the etching technique, the workpiece is etched in a strip pattern extending in the X-axis direction. The etching is performed to the depth of the interface between the substrate 5 and the first interconnect 10.

Figure 4C:
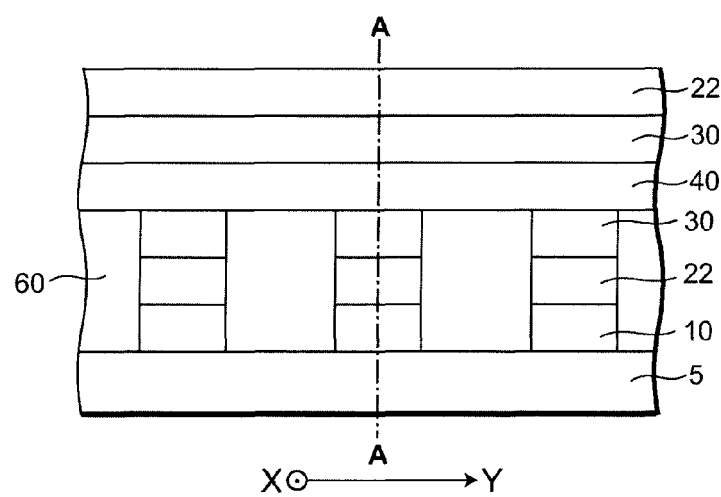

Next, as shown in FIG. 4C, an interlayer dielectric film (inter-element insulating film 60) is filled in the space formed by etching, and is planarized by CMP (chemical mechanical polishing). Subsequently, on the planarized surface, the layers of a second interconnect 40, a recording unit 30, and a rectifying element material layer 22 are formed in this order from bottom. These layers can be formed illustratively by the aforementioned sputtering method.

Figure 4D:
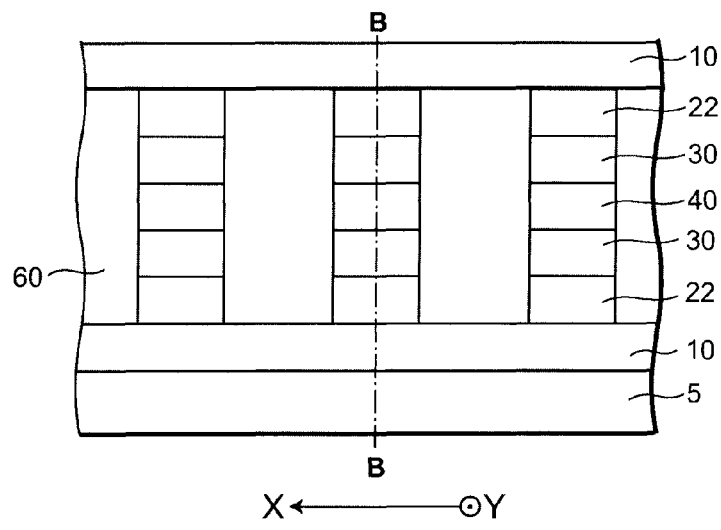

Next, the description is given with reference to FIG. 4D, which corresponds to a cross-sectional view taken along line A-A' of FIG. 4C.

As shown in FIG. 4D, by the photolithography and etching technique, the stacked layers are etched in a strip pattern extending in the Y-axis direction. The etching is performed to the depth of the interface between the first interconnect 10 and the rectifying element material layer 22. Subsequently, an interlayer dielectric film (inter-element insulating film 60) is filled in the space formed by etching, and is planarized illustratively by CMP. Subsequently, a layer to serve as a first interconnect 10 is formed.

Figure 5A:
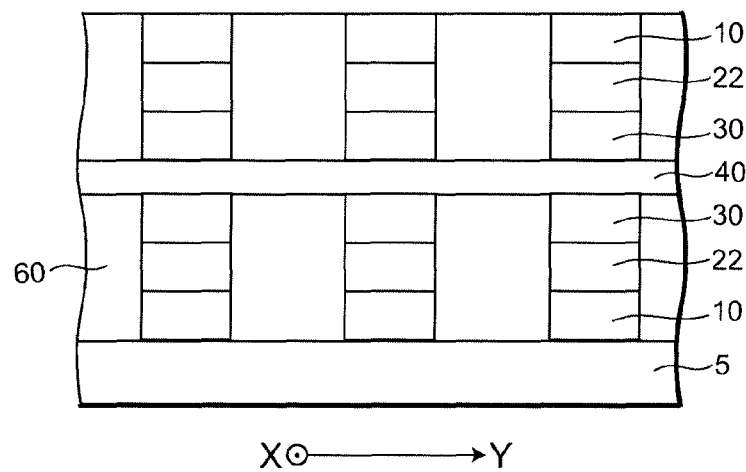

Next, the description is given with reference to FIG. 5A, which corresponds to a cross-sectional view taken along line B-B' of FIG. 4D.

As shown in FIG. 5A, by the photolithography and etching technique, the workpiece is etched in a strip pattern extending in the X-axis direction. The etching is performed to the depth of the interface between the second interconnect 40 and the recording unit 30. Subsequently, an interlayer dielectric film (inter-element insulating film 60) is filled in the space formed by etching, and the workpiece upper surface is planarized illustratively by CMP.

Thus, the structure of a two-layer cross-point nonvolatile storage device having two layers of recording units 30 is fabricated. Here, all the above steps are performed at a temperature lower than the crystallization temperature of the amorphous material included in the rectifying element material layer 22. Thus, in all the unit memory layers 2A, the amorphous material of the rectifying element material layer 22 is maintained in the amorphous state.

Figure 5B:
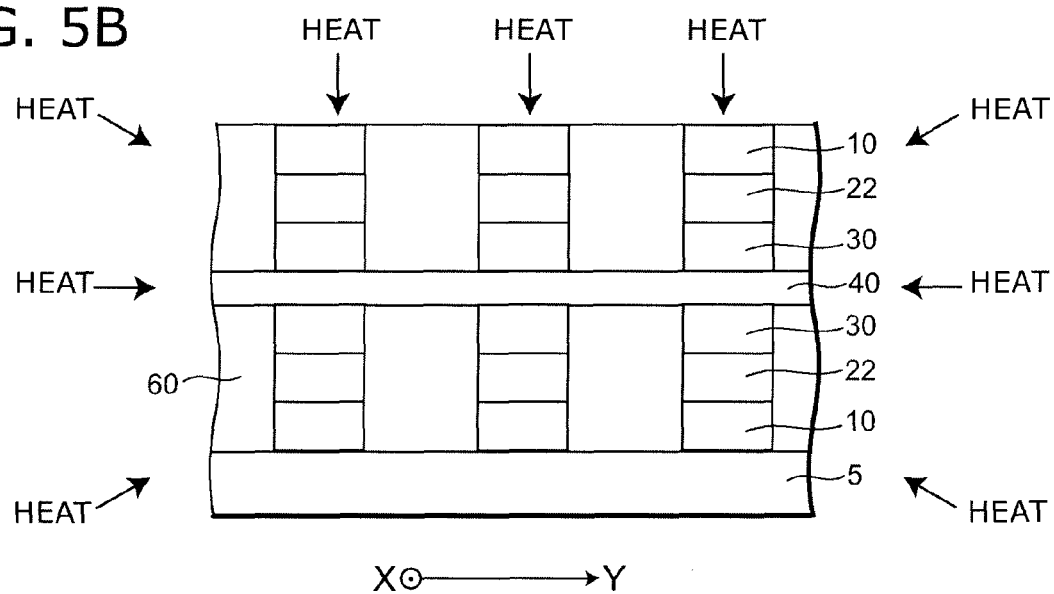

Next, as shown in FIG. 5B, heat treatment for crystallizing the amorphous material included in the rectifying element material layers 22 is simultaneously performed. Subsequently, heat treatment for activating the impurities included in the rectifying element material layers 22 is simultaneously performed. Thus, the rectifying elements 20 in different layers are simultaneously formed.

Figure 5C:
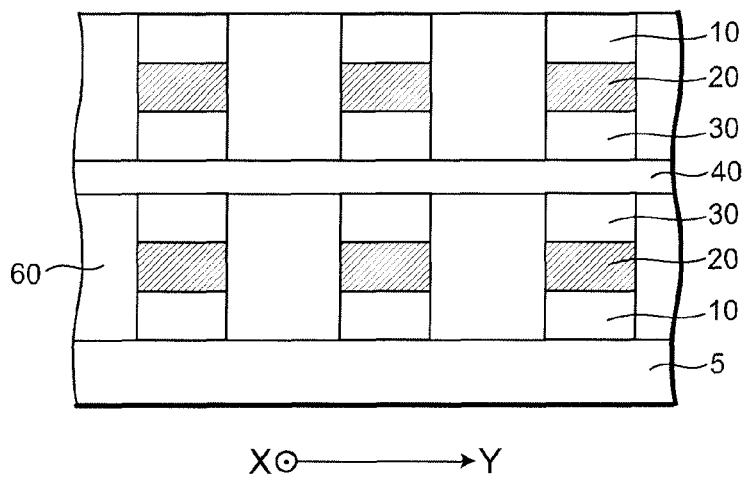

As shown in FIG. 5C, the above process results in fabricating a two-layer cross-point nonvolatile storage device, which includes the rectifying elements 20 having uniform crystallinity with the n-type and p-type impurities activated uniformly across the layers, and has uniform cell characteristics across the layers.

A nonvolatile storage device with more layers can be manufactured by repeating a process similar to the foregoing.

Next, another example of the method for manufacturing a nonvolatile storage device according to this embodiment (Example manufacturing method 2) is described with reference to FIGS. 6A to 8B.

Figure 7A:
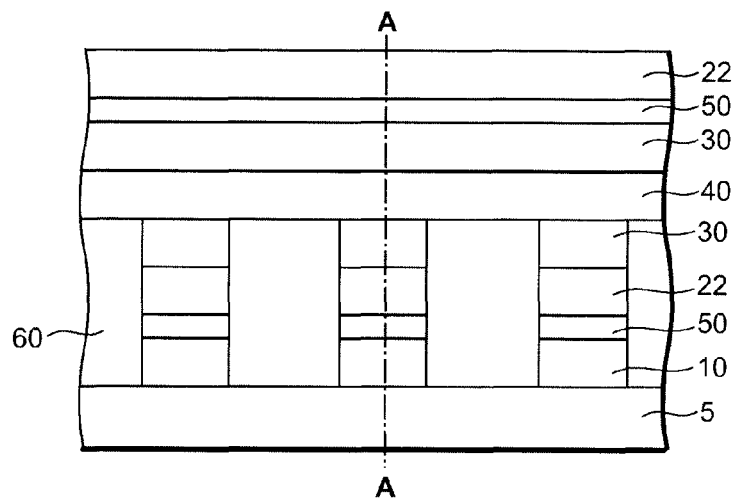
Figure 7B:
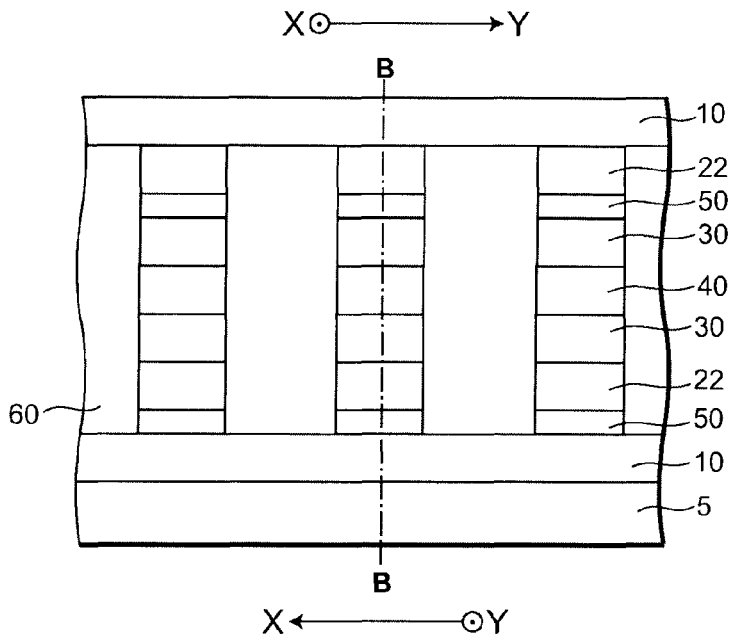
Figure 7C:
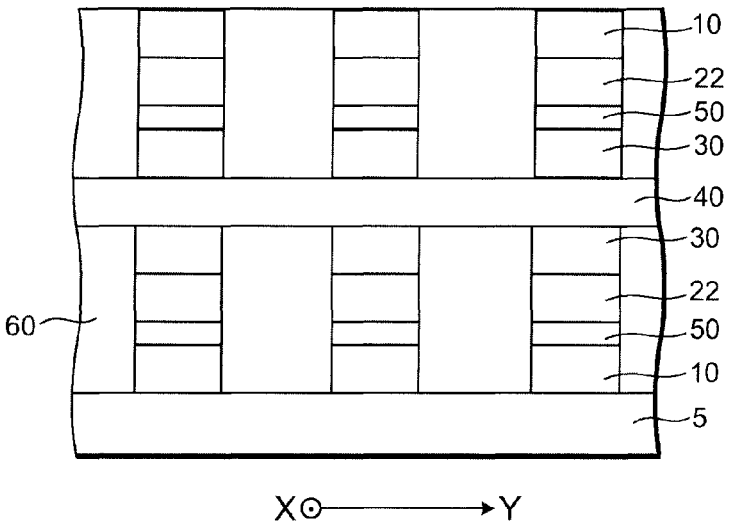

It is noted that FIG. 7B is a cross-sectional view taken along line A-A' of FIG. 7A, and FIG. 7C is a cross-sectional view taken along line B-B' of FIG. 7B.

The method for manufacturing a nonvolatile storage device is described below in the case where two unit memory layers 2A are layered.

FIGS. 6A to 8B are schematic process cross-sectional views showing Example manufacturing method 2. In addition to Example manufacturing method 1, this Example manufacturing method further includes the step of forming a substance serving as a nucleus for crystal growth (crystal nucleus 50) of the amorphous material included in the rectifying element material layer 22. For example, a crystal nucleus 50 is formed over the substrate before or after the step of forming the rectifying element material layer 22. The steps other than this step of forming a crystal nucleus 50 can be the same as those in Example manufacturing method 1.

Figure 6A:
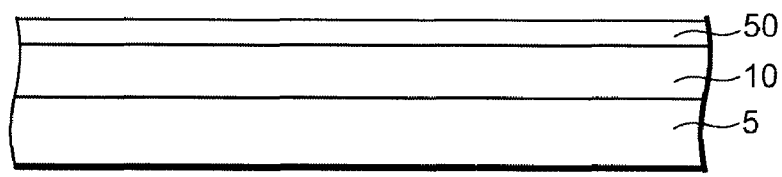
FIGS. 6A to 8B are schematic process cross-sectional views showing Example manufacturing method 2.

First, as shown in FIG. 6A, after a first interconnect 10 is formed, a substance serving as a nucleus for crystal growth (crystal nucleus 50) of the amorphous material to be included in the rectifying element material layer 22 is formed on the workpiece upper surface. It is considered that this results in decreasing the crystallization temperature and enabling crystallization of the amorphous material of the rectifying element material layer 22 by heat treatment at a relatively low temperature.

This crystal nucleus 50 can be illustratively made of Ni, Co, Pd, Pt, Cu, Ag, Au, In, Sn, Al, or Sb. Among them, Ni (nickel) is particularly preferable. More specifically, $NiSi_2$ formed by reaction of Ni and silicon has a fluorite (calcium fluoride) crystal structure with a lattice constant of 5.406 Å, and this structure is close to the structure of silicon, which has a diamond crystal structure with a lattice constant of 5.430 Å. Hence, Ni is likely to serve as a crystal nucleus for crystallization of amorphous silicon.

Furthermore, if the crystal nucleus 50 is made of the same material as the first interconnect 10, contamination of the first interconnect 10 by the crystal nucleus 50 is advantageously avoided.

The concentration of the crystal nucleus formed over the substrate is illustratively $1 \times 10^{13}$ to $3 \times 10^{14}$ $cm^{-2}$ in terms of planar atomic concentration. If the planar concentration of the crystal nucleus is lower than $1 \times 10^{13}$ $cm^{-2}$, it is difficult to sufficiently decrease the crystallization temperature. Conversely, if the planar concentration of the crystal nucleus is higher than $3 \times 10^{14}$ $cm^{-2}$, local silicidation occurs, which makes it difficult to form a polycrystalline silicon film.

The crystal nucleus 50 can be formed illustratively by a sputtering method such as DC (direct current) sputtering. The crystal nucleus 50 may be formed simultaneously with the first interconnect 10.

Figure 6B:
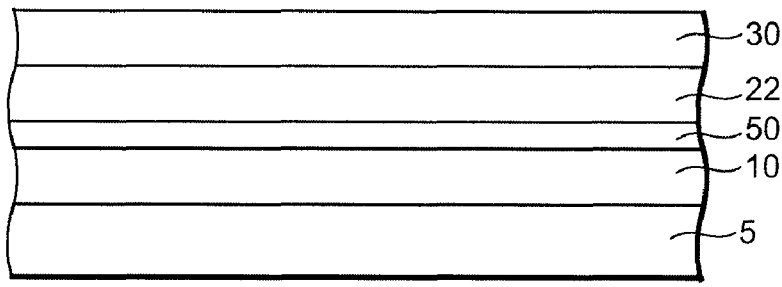
Figure 6C:
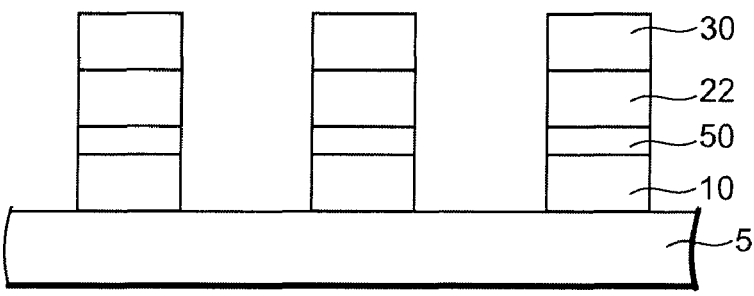
Figure 6C:

Next, as shown in FIGS. 6B and 6C, as in Example manufacturing method 1 (FIGS. 4A and 4B), the layers of a rectifying element material layer 22 and a recording unit 30 are formed, and etched in a strip pattern extending in the X-axis direction.

Next, as shown in FIG. 7A, as in Example manufacturing method 1 (FIG. 4C), an interlayer dielectric film (inter-element insulating film 60) is filled and planarized, and the layers of a second interconnect 40 and a recording unit 30 are formed.

Subsequently, in the manner described above with reference to FIG. 6A, a crystal nucleus 50 is formed on the workpiece upper surface. Here, if the crystal nucleus 50 is made of the same material as the upper electrode of the recording unit 30, contamination of the recording unit 30 (upper electrode) by the crystal nucleus 50 is advantageously avoided.

Subsequently, the layer of a rectifying element material layer 22 is formed.

Next, as shown in FIG. 7B, as in Example manufacturing method 1 (FIG. 4D), etching is performed in a strip pattern extending in the Y-axis direction, and an interlayer dielectric film (inter-element insulating film 60) is filled and planarized. Further subsequently, the layer of a first interconnect 10 is formed.

Next, as shown in FIG. 7C, as in Example manufacturing method 1 (FIG. 5A), etching is performed in a strip pattern extending in the X-axis direction, an interlayer dielectric film (inter-element insulating film 60) is filled, and is planarized.

Thus, the structure of a two-layer cross-point nonvolatile storage device is fabricated.

Here, all the above steps are performed at a temperature lower than the crystallization temperature of the amorphous material included in the rectifying element material layer 22. Thus, in all the unit memory layers 2A, the amorphous material of the rectifying element material layer 22 is maintained in the amorphous state.

Figure 8A:
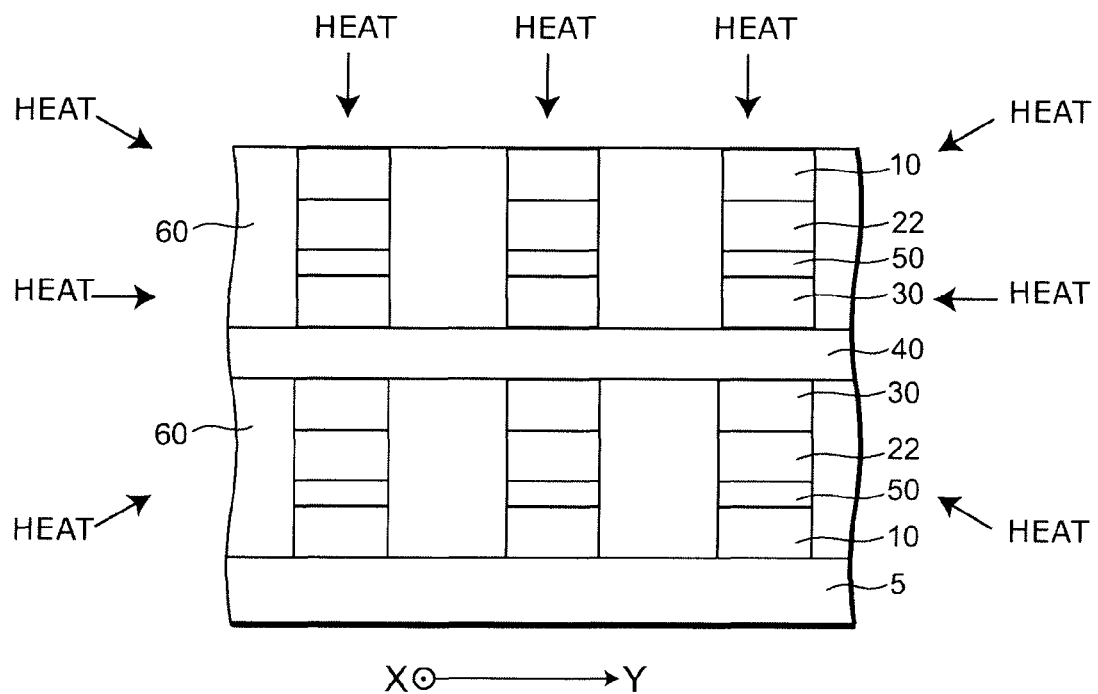

Next, as shown in FIG. 8A, heat treatment for crystallizing the amorphous material included in the rectifying element material layers 22 is simultaneously performed. Subsequently, heat treatment for activating the impurities included in the rectifying element material layers 22 is simultaneously performed. Thus, the rectifying elements 20 in different layers are simultaneously formed.

Figure 8B:
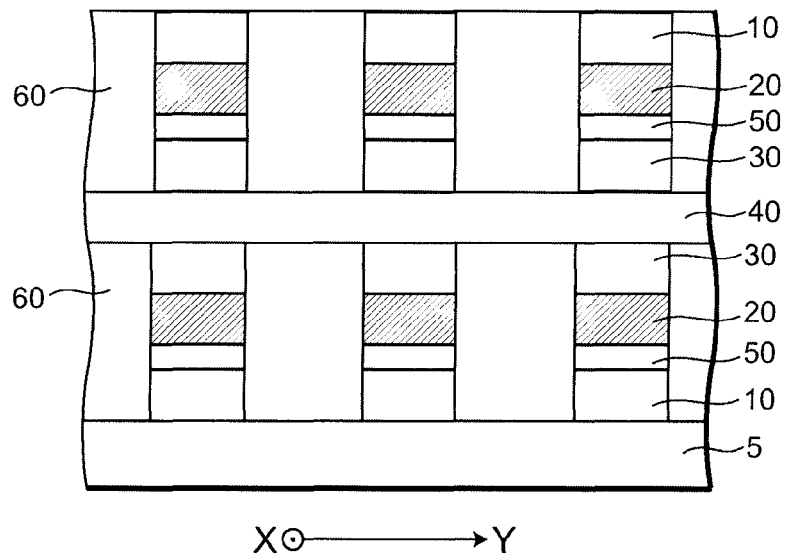

As shown in FIG. 8B, the above process results in fabricating a two-layer cross-point nonvolatile storage device, which includes the rectifying elements 20 with the n-type and p-type impurities activated uniformly across the layers, and has uniform cell characteristics across the layers. In this Example manufacturing method, the amorphous material of the rectifying element material layer 22 can be crystallized relatively easily by using the crystal nucleus 50.

A nonvolatile storage device with more layers can be manufactured by repeating a process similar to the foregoing.

In FIGS. 6A to 8B, the crystal nucleus 50 is schematically depicted as a layer configuration. However, the crystal nucleus 50 is not limited to such configuration, but may be scattered over the substrate, for example.

PRACTICAL EXAMPLE 1

Next, a first practical example (Practical example 1) of the nonvolatile storage device according to this embodiment is described with reference to FIGS. 9A to 13.

First, the nonvolatile storage device according to Practical example 1 is described with reference to FIG. 13.

Figure 13:
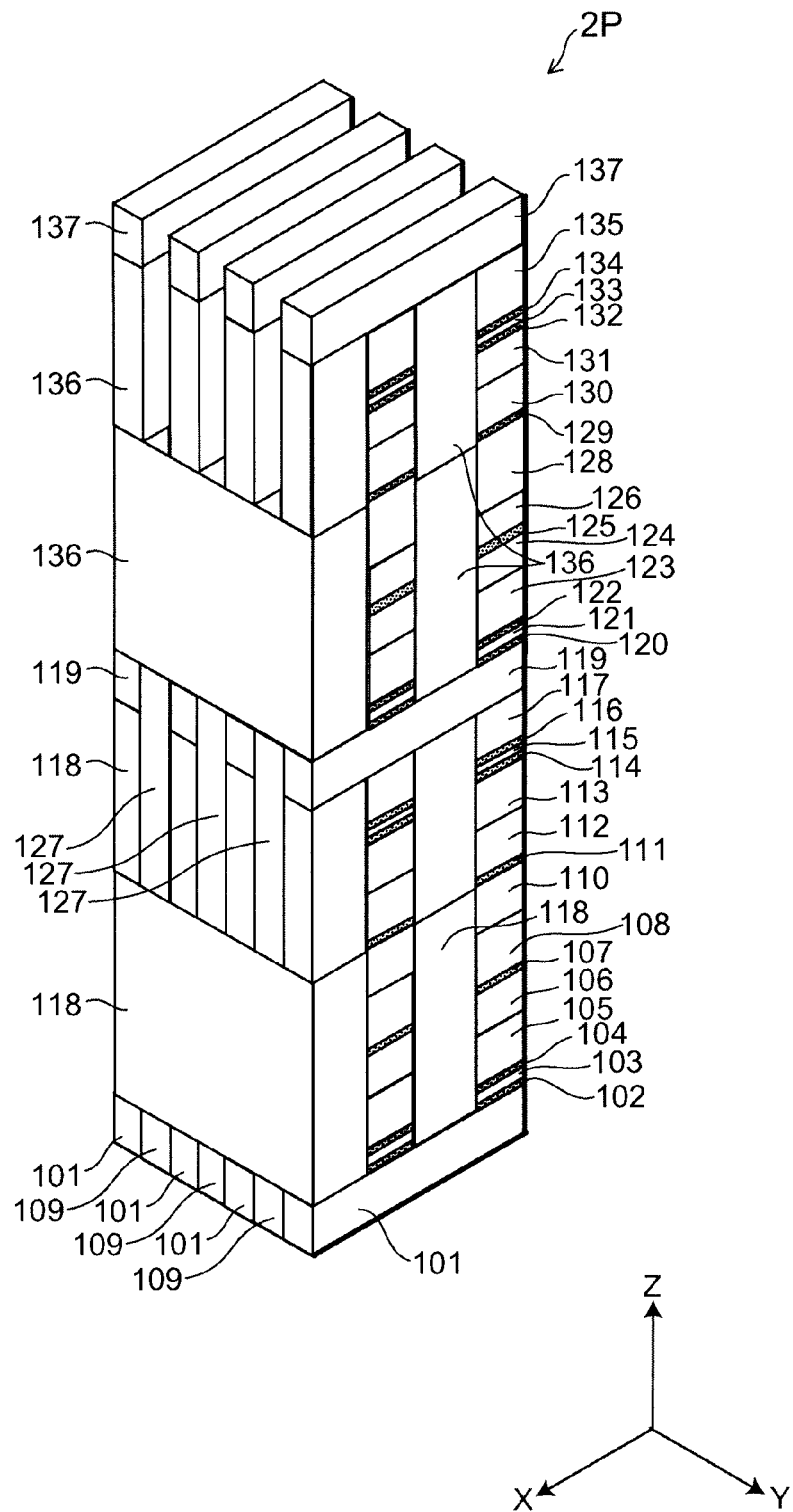
FIG. 13 is a schematic process perspective view illustrating the method for manufacturing the nonvolatile storage device 2P according to Practical example 1 and a schematic perspective view illustrating the configuration of the nonvolatile storage device 2P.

FIG. 13 is a schematic perspective view illustrating the configuration of a nonvolatile storage device 2P according to Practical example 1 (this is also a schematic process perspective view as described later).

The nonvolatile storage device 2P according to Practical example 1 has a structure similar to that of the nonvolatile storage device 2 according to Example 1, except that the bit lines and the word lines are interchanged in FIGS. 1A and 1B. More specifically, in the configuration of FIGS. 1A and 1B, sequentially from bottom, bit lines, word lines, bit lines, word lines, and bit lines are arranged. Furthermore, in the configuration illustrated in FIG. 2, one unit memory layer 2A, e.g., the lowest unit memory layer 2A, has a structure in which bit lines BL are located at the bottom, and an electrode layer 36, a recording layer 34, an electrode layer 32, a rectifying element 20, a barrier layer, and word lines WL are layered thereon. It is noted that in the unit memory layer 2A of the second stage, for example, the aforementioned multilayer structure is reversed upside down. Furthermore, a CMP stopper layer used in the course of the manufacturing method is located in the multilayer structure.

Next, the method for manufacturing the nonvolatile storage device 2P is described with reference to FIGS. 9A to 13. FIGS. 9A to 13 are schematic process perspective views illustrating the method for manufacturing the nonvolatile storage device 2P. Here, to avoid complication, the description of the steps of forming peripheral circuits and the like is omitted.

First, as shown in FIG. 9A, a tungsten film 101 to serve as first-layer bit lines is formed to a thickness of 50 nm on a semiconductor substrate. This tungsten film 101 does not need to serve as bit lines of the lowermost layer in a so-called multilayer memory, but may be a film for bit lines of the second, third or other layer.

Subsequently, over the substrate, using room-temperature DC (direct current) sputtering, a titanium nitride film 102 to serve as an electrode layer of a recording unit 30 is formed to a thickness of 10 nm, an $NiO_x$ film 103 to serve as a resistance change layer (recording layer 34) is formed to a thickness of 10 nm, and a titanium nitride film 104 to serve as an electrode layer of the recording unit 30 is formed to a thickness of 10 nm.

Subsequently, over the substrate, a substance serving as a nucleus for crystal growth of diodes (e.g., Ni (nickel)) is formed at a concentration of $1 \times 10^{13}$ to $3 \times 10^{14}$ cm$^{-2}$ (not shown).

Next, on the workpiece upper surface, using room-temperature DC sputtering, a P-doped (phosphorus-doped) amorphous silicon film 105 and a B-doped (boron-doped) amorphous silicon film 106 constituting the diodes are each formed to a thickness of 50 nm, a titanium nitride film 107 to serve as a barrier layer is formed to a thickness of 10 nm, and a tungsten film 108 to serve as a CMP stopper layer is formed to a thickness of 50 nm. The aforementioned P-doped amorphous silicon film serves as an n-type semiconductor, and the B-doped amorphous silicon film serves as a p-type semiconductor.

Next, as shown in FIG. 9B, by the lithography and reactive ion etching technique, the stacked films are collectively patterned into a line pattern extending in the first direction (X-axis direction). The etching is performed to the depth of the interface between the substrate and the bit line 101.

Next, as shown in FIG. 9C, an interlayer dielectric film 109 is filled in the space between the multilayer films formed by etching, and is planarized by CMP. Subsequently, on the workpiece upper surface, a tungsten film 110 to serve as word lines shared by the first layer and the second layer (hereinafter referred to as "first/second-layer shared word lines"; other shared interconnects being also named similarly) is formed to a thickness of 50 nm, and a titanium nitride film 111 to serve as a barrier layer is formed to a thickness of 10 nm.

Subsequently, over the substrate, a substance serving as a nucleus for crystal growth of diodes, such as Ni, is formed at a concentration of $1 \times 10^{13}$ to $3 \times 10^{14}$ cm$^{-2}$ (not shown).

Next, over the substrate, using room-temperature DC sputtering, a B-doped amorphous silicon film 112 and a P-doped amorphous silicon film 113 constituting the diodes are each formed to a thickness of 50 nm, a titanium nitride film 114 to serve as an electrode layer of a recording unit 30 is formed to a thickness of 10 nm, an $NiO_x$ film 115 to serve as a recording layer is formed to a thickness of 10 nm, a titanium nitride film 116 to serve as an electrode layer of the recording unit 30 is formed to a thickness of 10 nm, and a tungsten film 117 to serve as a CMP stopper layer is formed to a thickness of 50 nm.

Figure 10:
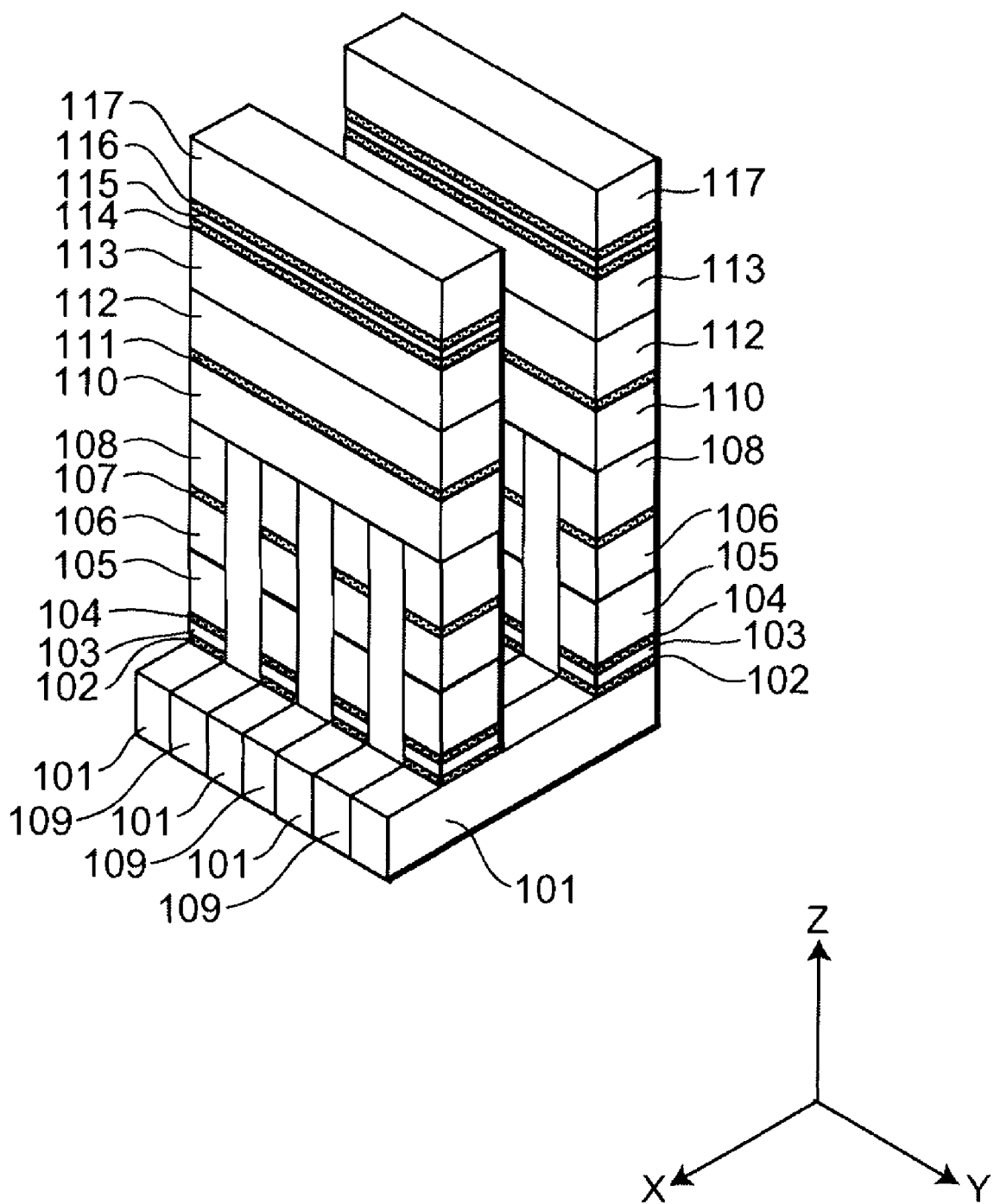

Next, as shown in FIG. 10, by the lithography and reactive ion etching technique, the above multilayer film (from the tungsten film 117 to the titanium nitride film 102) is collectively patterned into a line pattern extending in the second direction (Y-axis direction). The etching is performed to the depth of the interface between the first-layer bit line 101 and the lower electrode 102.

Figure 11:
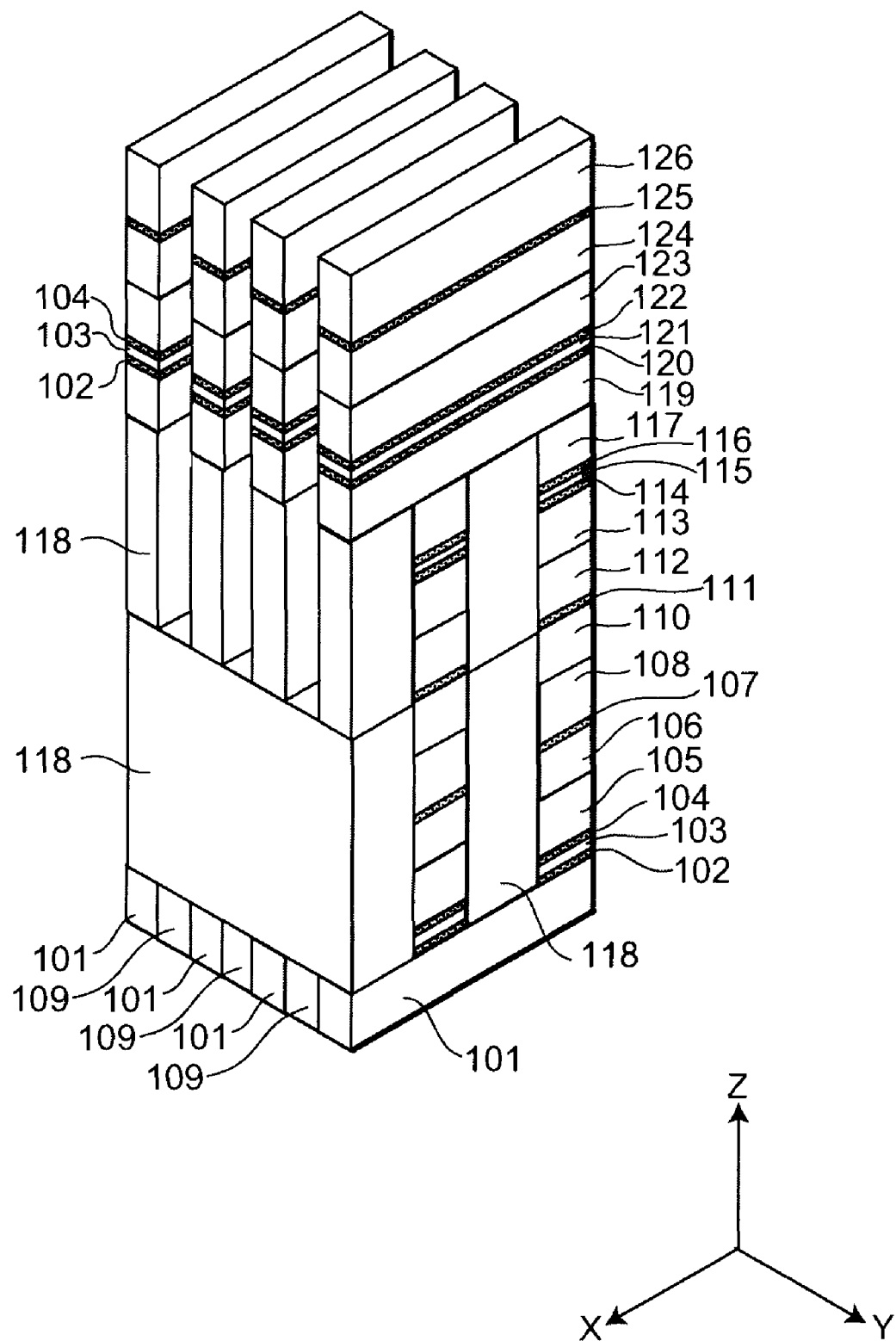

Next, as shown in FIG. 11, an interlayer dielectric film 118 is filled in the space between the above multilayer films formed by etching, and is planarized by CMP. Subsequently, over the substrate, like the first layer, a tungsten film 119 to serve as second/third-layer shared bit lines, a titanium nitride film 120 to serve as an electrode layer of a recording unit 30, an $NiO_x$ film 121 to serve as a recording layer, a titanium nitride film 122 to serve as an electrode layer of the recording unit 30 are formed by room-temperature DC sputtering.

Subsequently, over the substrate, a substance serving as a nucleus for crystal growth of diodes, such as Ni, is formed at a concentration of $1 \times 10^{13}$ to $3 \times 10^{14}$ cm$^{-2}$ (not shown).

Next, over the substrate, using room-temperature DC sputtering, a P-doped amorphous silicon film 123 and a B-doped amorphous silicon film 124 constituting the diodes, a titanium nitride film 125 to serve as a barrier layer, and a tungsten film 126 to serve as a CMP stopper layer are formed in this order from bottom. The respective thicknesses are the same as those described above with reference to the first layer.

Next, by the lithography and reactive ion etching technique, the above multilayer film (from the tungsten film 126 to the titanium nitride film 111) is patterned into lines extending in the X-axis direction. The etching is performed to the depth of the interface between the tungsten film 110 to serve as first/second-layer shared word lines and the barrier layer 111.

Figure 12:
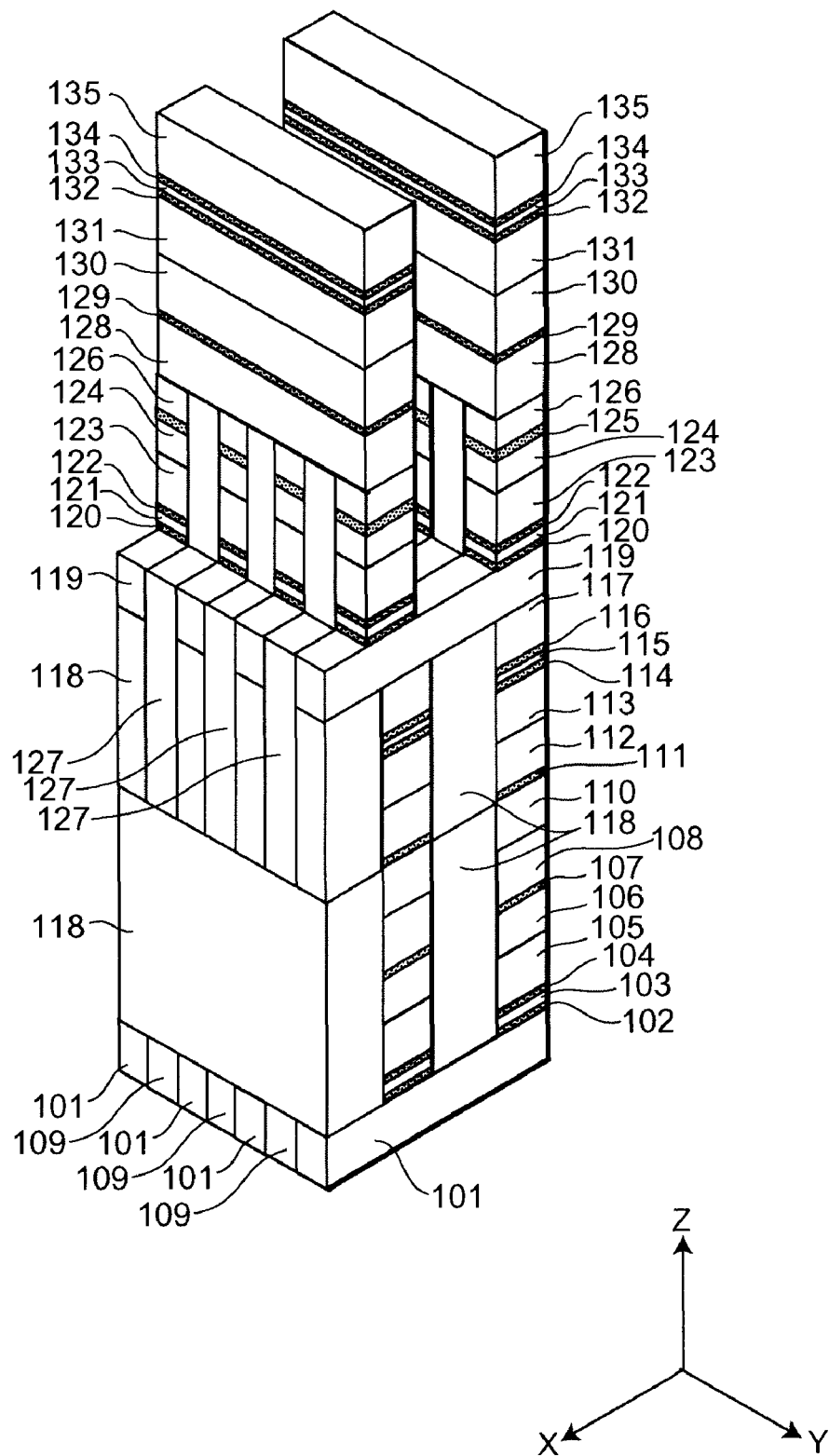

Next, as shown in FIG. 12, an interlayer dielectric film 127 is buried in the space between the above multilayer films formed by etching, and is planarized by CMP. Subsequently, over the substrate, like the second layer, a tungsten film 128 to serve as third/fourth-layer shared word lines and a titanium nitride film 129 to serve as a barrier layer are formed. The respective thicknesses are the same as those described above with reference to the second layer.

Subsequently, over the substrate, a substance serving as a nucleus for crystal growth of diodes, such as Ni, is formed at a concentration of $1 \times 10^{13}$ to $3 \times 10^{14}$ cm$^{-2}$ (not shown).

Next, over the substrate, using room-temperature DC sputtering, the layers of a B-doped amorphous silicon film 130 and a P-doped amorphous silicon film 131 constituting the diodes, a titanium nitride film 132 to serve as an electrode layer of a recording unit 30, an $NiO_x$ film 133 to serve as a recording layer 34, a titanium nitride film 134 to serve as an electrode layer of the recording unit 30, and a tungsten film 135 to serve as a CMP stopper layer are formed. The respective thicknesses are the same as those described above with reference to the second layer.

Next, by the lithography and reactive ion etching technique, the above multilayer film (from the tungsten film 135 to the titanium nitride film 120) is collectively patterned into a line pattern extending in the Y-axis direction. The etching is performed to the depth of the interface between the tungsten film 119 to serve as second/third-layer shared bit lines and the titanium nitride film 120.

Next, as shown in FIG. 13, an interlayer dielectric film 136 is filled in the space between the above multilayer films formed by etching, and is planarized by CMP. Subsequently, over the substrate, a tungsten film 137 to serve as fourth-layer bit lines illustratively made of tungsten is formed.

Subsequently, by the lithography and reactive ion etching technique, the above multilayer film (from the tungsten film 137 to the titanium nitride film 129) is collectively patterned into a line pattern extending in the X-axis direction. The etching is performed to the depth of the interface between the tungsten film 128 to serve as third/fourth-layer shared word lines and the titanium nitride film 129. Subsequently, an interlayer dielectric film, not shown, is filled in the space between the multilayer films formed by etching.

Thus, the structure of a four-layer nonvolatile storage device is fabricated. A multilayer memory with more than four layers can be fabricated by repeating the foregoing procedure.

Next, heat treatment is performed on the above workpiece. The heat treatment is performed illustratively in a diffusion furnace at 540-620° C. for several to several ten hours. This simultaneously crystallizes the amorphous layers constituting diodes in different layers. In this temperature region, B (boron) in the p-type semiconductor and P (phosphorus) in the n-type semiconductor constituting the diodes are hardly diffused, and hence the p-n junction profile (the impurity concentration profile in the vicinity of the p-n junction interface) is hardly varied.

Next, RTP (rapid thermal process) is used to perform annealing at 1000° C. for 10 seconds, for example. This simultaneously activates impurities constituting diodes in different layers, and the diode formation is completed.

The above process results in fabricating a nonvolatile storage device 2P according to this Practical example, which has uniform cell characteristics across the layers.

In the foregoing, the resistance change layer (recording layer 34) is illustratively made of $NiO_x$. However, the resistance change layer can be made of any material which changes the resistance state in response to the voltage applied thereacross. For example, the resistance change layer can include at least one selected from the group consisting of C, $NbO_x$, Cr-doped $SrTiO_{3-x}$, $Pr_xCa_yMnO_z$, $ZrO_x$, $NiO_x$, Ti-doped $NiO_x$, $ZnO_x$, $TiO_x$, $TiO_xN_y$, $CuO_x$, $GdO_x$, $CuTe_x$, $HfO_x$, $ZnMn_xO_y$, and $ZnFe_xO_y$, or at least one selected from the group consisting of chalcogenide-based GST ($Ge_xSb_y$-$Te_z$), doped GST such as N-doped GST and O-doped GST, $Ge_xSb_y$, and $In_xGe_yTe_z$, which change the resistance state by Joule's heat generated by the voltage applied thereacross. Furthermore, the resistance change layer can include a material in which two or more of these materials are mixed. Moreover, a multilayer structure including a plurality of layers made of these materials can be used.

In the foregoing, the electrode of the recording unit 30 is illustratively made of titanium nitride. However, the electrode can be made of various materials which do not react with the aforementioned material of the resistance change layer to compromise its variable resistance. Specifically, for example, the electrode can include at least one selected from the group consisting of tungsten nitride, titanium nitride, titanium aluminum nitride, tantalum nitride, titanium nitride silicide, tantalum carbide, titanium silicide, tungsten silicide, cobalt silicide, nickel silicide, nickel platinum silicide, platinum, ruthenium, platinum-rhodium, and iridium. Furthermore, the electrode can include a material in which two or more of these materials are mixed. Moreover, a multilayer structure including a plurality of layers made of these materials can be used.

In the foregoing, the substance serving as a nucleus for crystal growth (crystal nucleus) of diodes is illustratively Ni (nickel). However, it is also possible to use other materials, such as Ni, Co, Pd, Pt, Cu, Ag, Au, In, Sn, Al, and Sb. In particular, if the crystal nucleus is made of the same material as the word lines/bit lines, contamination of the interconnects by the crystal nucleus is advantageously avoided.

In the foregoing, amorphous silicon used for diodes is formed by DC sputtering. However, it can also be formed by methods such as plasma CVD (chemical vapor deposition), LPCVD (low pressure chemical vapor deposition), and coating. Impurity doping of the diode layer can be performed by ion implantation. These various methods can be used alone or in combination.

The thicknesses of various films described above are illustrative only, and they can be variously modified.

As described above, this embodiment can provide a nonvolatile storage device having good operating characteristics and being easily processed, and a method for manufacturing the same.

Thus, in this embodiment, variations in memory cell characteristics can be suppressed even if the number of layered films is increased. Hence, this embodiment has an advantage of being able to produce a resistance change memory suitable for increased capacity.

PRACTICAL EXAMPLE 2

Next, a second practical example (Practical example 2) of the nonvolatile storage device according to this embodiment is described with reference to FIGS. 14 to 18B.

First, the nonvolatile storage device according to Practical example 2 is described with reference to FIG. 14.

Figure 14:
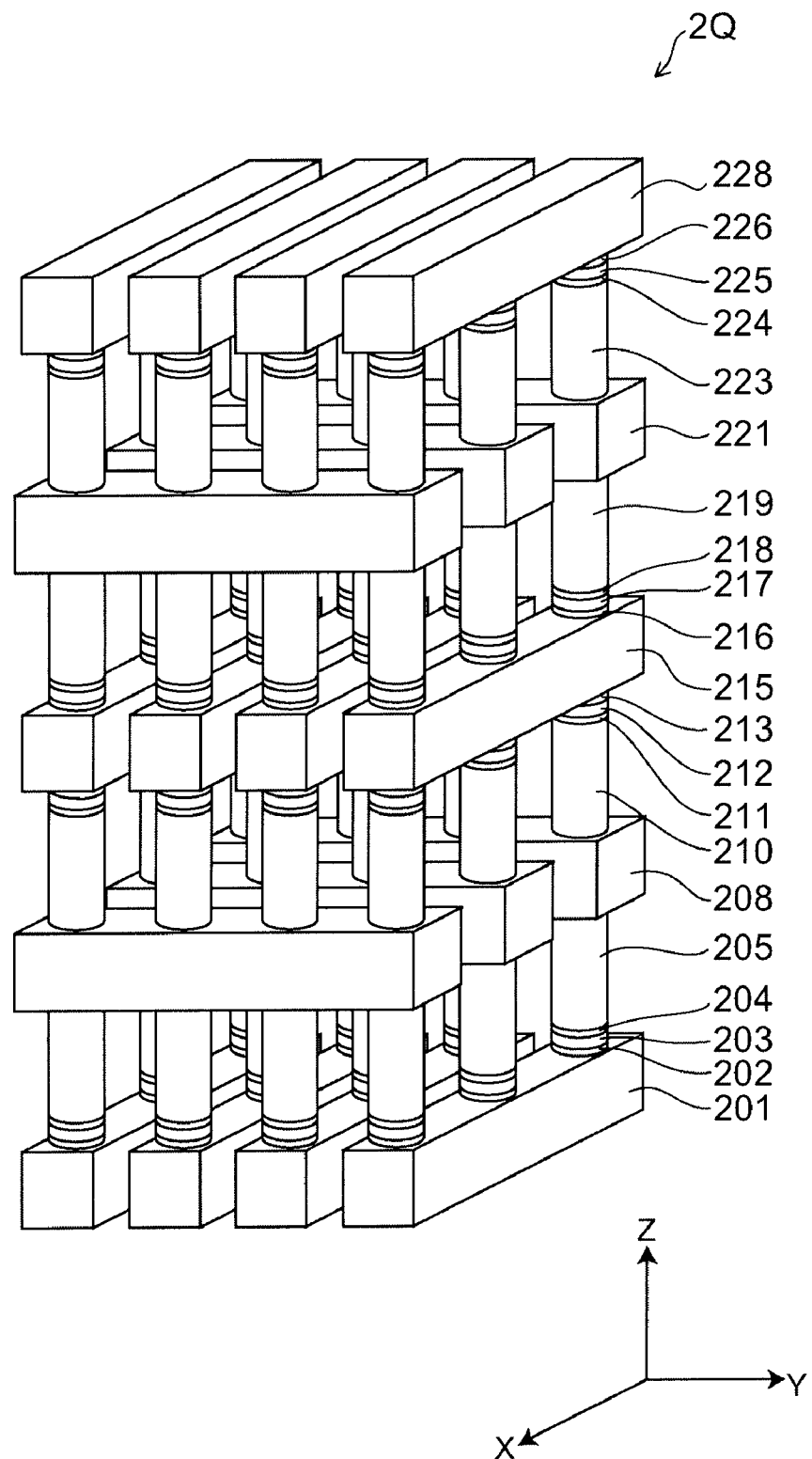
FIG. 14 is a schematic perspective view illustrating the configuration of a nonvolatile storage device 2Q according to Practical example 2.

FIG. 14 is a schematic perspective view illustrating the configuration of a nonvolatile storage device 2Q according to Practical example 2. For clarity of illustration of the multilayer structure, interlayer dielectric films are not shown.

As shown in FIG. 14, the nonvolatile storage device 2Q according to Practical example 2 has a structure similar to that of the nonvolatile storage device 2P according to Practical example 1. More specifically, as shown, bit lines 201, an electrode layer 202, a recording layer 203, an electrode layer 204, a rectifying element 205, word lines 208, a rectifying element 210, an electrode layer 211, a recording layer 212, an electrode layer 213, bit lines 215 and the like are layered sequentially from bottom.

In Practical example 2, the cell unit including the rectifying element and the recording layer, such as the portion from the electrode layer 202 to the rectifying element 205, is processed not simultaneously with word lines or bit lines, but is processed independently into a columnar shape. That is, the processing is performed in the sequence of forming and processing a bit line material, forming and processing a multilayer film of electrode layer/recording layer/electrode layer/rectifying element, forming and processing a word line material, forming and processing a multilayer film of rectifying element/electrode layer/recording layer/electrode layer, and forming and processing a bit line material.

Such a manufacturing method requires a step of independently processing the cell unit into a columnar shape, such as a lithography step, which increases the number of processing steps. However, the multilayer film of rectifying element/electrode layer/recording layer/electrode layer does not need to be patterned collectively with word lines or bit lines. Hence, the thickness of the multilayer film processed in one etching step remains under the total thickness of the multilayer film of electrode layer/recording layer/electrode layer/rectifying element. Thus, the height of the processed pattern is restricted, and hence the pattern can avoid bending, collapsing and the like. This ensures more adequate performance and quality, and facilitates processing.

In the following, the method for manufacturing the nonvolatile storage device 2Q is described with reference to FIGS. 15A to 18B. FIGS. 15A to 18B are schematic process cross-sectional views illustrating the method for manufacturing the nonvolatile storage device 2Q. Here, FIGS. 15A, 16A, 17A, 18A, 15C, 16C, 17C, and 18C are schematic process cross-sectional views as viewed in the word line direction (Y-axis direction), and FIGS. 15B, 16B, 17B, 18B, 15D, 16D, 17D, and 18D are schematic process cross-sectional views as viewed in the bit line direction (X-axis direction), corresponding to FIG. 15A, 16A, 17A, 18A, 15C, 16C, 17C, and 18C, respectively. It is noted that the description of the steps of forming peripheral circuits and the like is omitted.

Figure 15A:
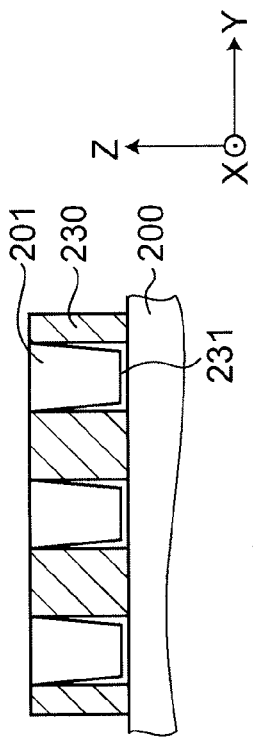
Figure 15B:
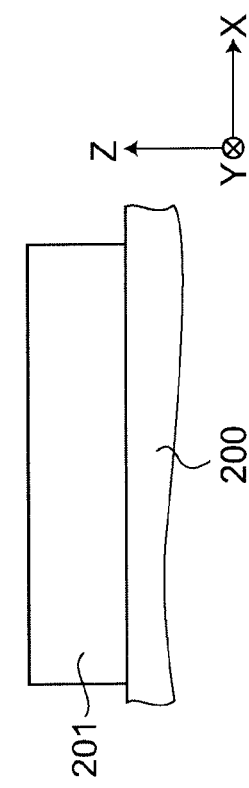

First, as shown in FIGS. 15A and 15B, an interlayer dielectric film 230 is formed on a semiconductor substrate 200. Subsequently, trenches serving as a template for bit lines 201 are formed in the interlayer dielectric film 230 by the lithography and reactive ion etching technique. Next, a TiN film 231 to serve as a barrier layer is formed to a thickness of 10 nm by sputtering. Subsequently, a tungsten film 201 to serve as bit lines is formed to a thickness of 70 nm to completely fill the trenches, and is planarized by CMP. Thus, bit lines are formed. As in Practical example 1, these bit lines 201 do not need to be bit lines of the lowermost layer in a multilayer memory, but may be bit lines of an upper layer.

Figure 15C:
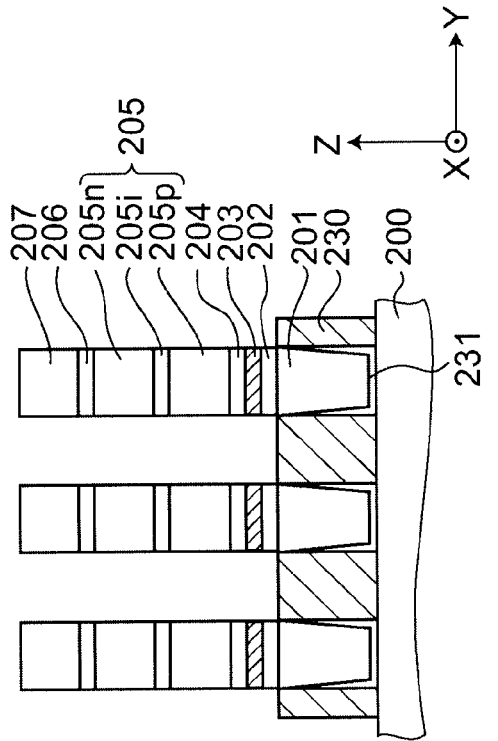
Figure 15D:
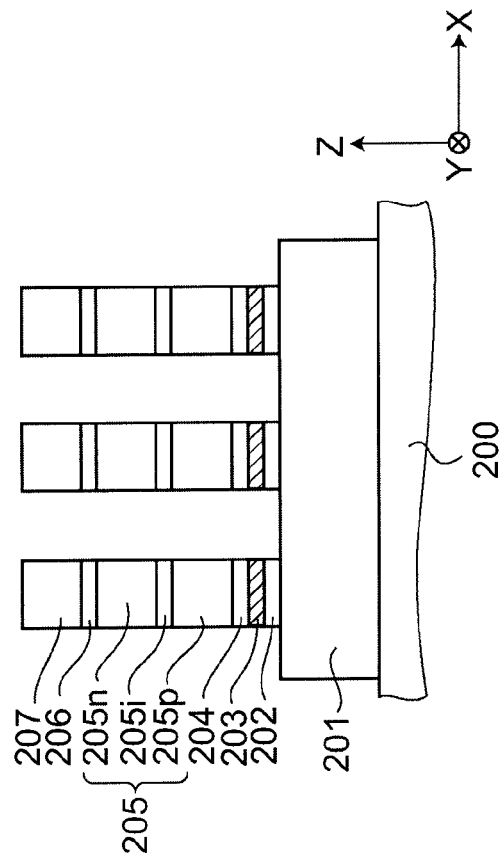

Next, as shown in FIGS. 15C and 15D, a titanium nitride film 202 to serve as a lower electrode of a recording unit is formed to a thickness of 10 nm, a C (carbon) film 203 to serve as a recording layer is formed to a thickness of 10 nm, a titanium nitride film 204 to serve as an upper electrode of the recording unit is formed to a thickness of 10 nm, a B-doped (boron-doped) amorphous silicon film 205$p$ to serve as a p-layer of a rectifying element, pin (p-intrinsic-n) diode, is formed to a thickness of 50 nm, a non-doped amorphous silicon film 205$i$ to serve as an i-layer of the rectifying element is formed to a thickness of 10 nm, and a P-doped (phosphorus-doped) amorphous silicon film 205$n$ to serve as an n-layer of the rectifying element is formed to a thickness of 50 nm.

Subsequently, on the workpiece upper surface, a substance serving as a nucleus for crystal growth of diodes (e.g., Ni) is formed at a density of $1 \times 10^{13}$ to $3 \times 10^{14}$ cm$^{-2}$ (not shown).

Next, on the workpiece upper surface, a titanium nitride film 206 to serve as a barrier layer is formed to a thickness of 10 nm, and a tungsten film 207 to serve as a CMP stopper layer is formed to a thickness of 50 nm.

Next, by the lithography and reactive ion etching technique, the stacked films are collectively patterned in the X-axis and Y-axis direction. Thus, the cell unit assumes a columnar shape as shown in FIGS. 15C and 15D. In this method, the multilayer film of electrode layer 202/recording layer 203/electrode layer 204/rectifying element 205 does not need to be processed simultaneously with word lines or bit lines. Hence, the thickness of the multilayer film processed in one etching step remains under the total thickness of the multilayer film of electrode layer 202/recording layer 203/electrode layer 204/rectifying element 205, and barrier layer 206/CMP stopper layer 207. Thus, the height of the processed pattern is restricted, and hence the pattern can avoid bending, collapsing and the like. This ensures more adequate performance and quality, and facilitates processing.

Figures 16A, 16B:
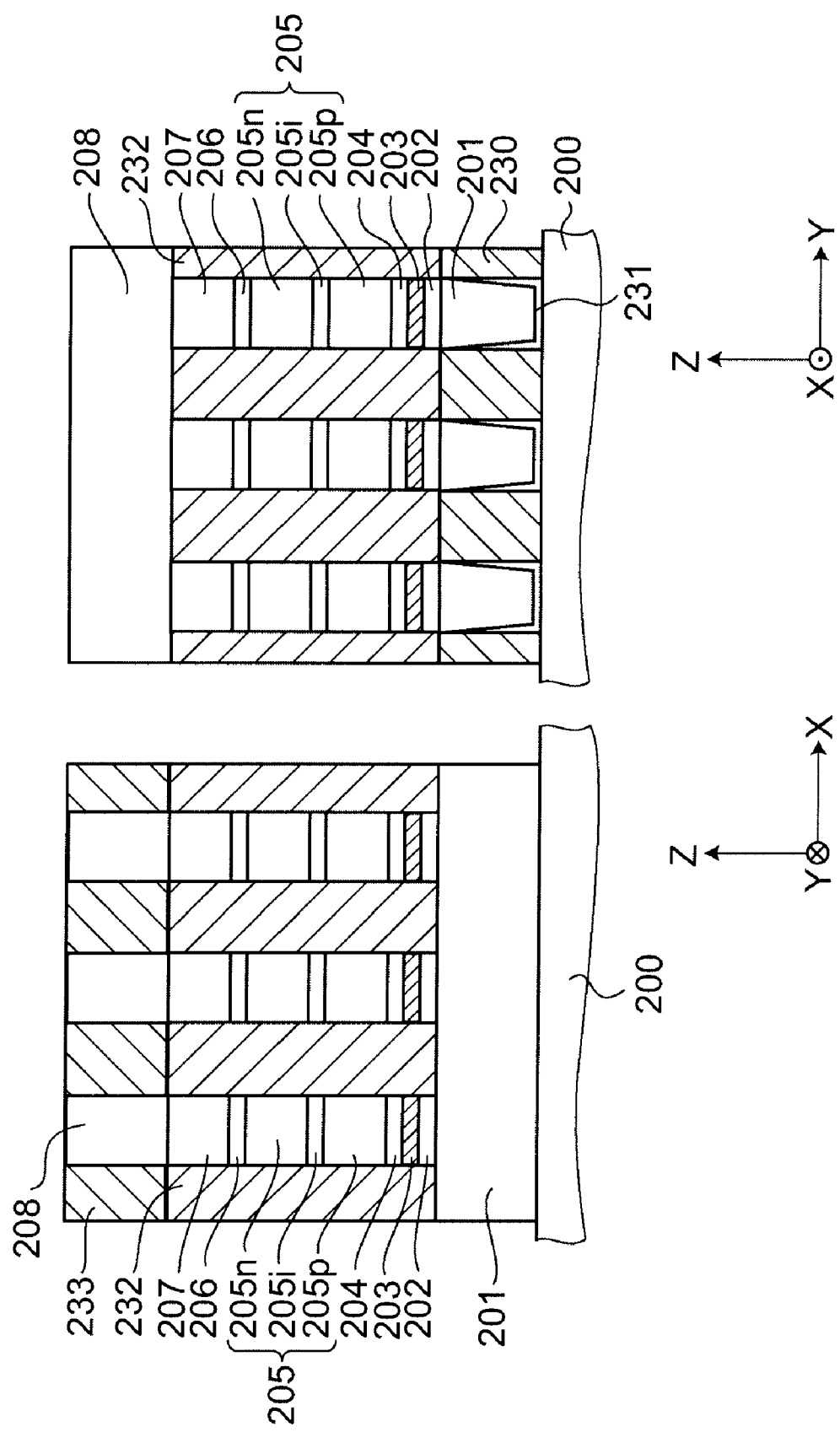

Next, as shown in FIGS. 16A and 16B, an interlayer dielectric film 232 is buried between the cell units processed into a columnar shape. Subsequently, the workpiece upper surface is planarized by CMP using the tungsten film 207 as a stopper.

Next, an interlayer dielectric film 233 is formed over the substrate. Subsequently, trenches serving as a template for word lines 208 are formed in the interlayer dielectric film 233 by the lithography and reactive ion etching technique. Subsequently, a tungsten film 208 to serve as word lines is formed to a thickness of 70 nm to completely fill the trenches, and is planarized by CMP. Thus, word lines are formed.

Figures 17A, 17B:
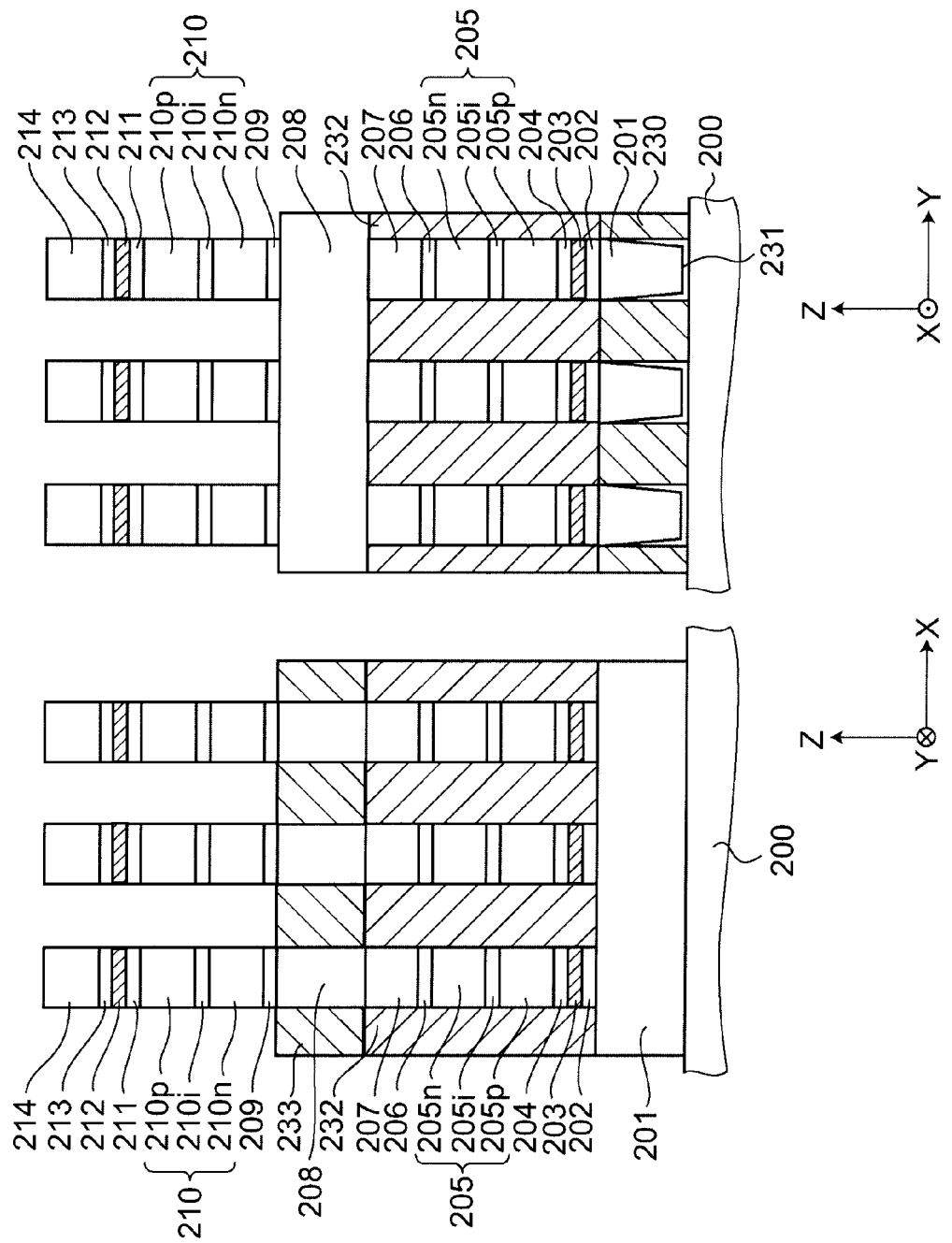

Next, as shown in FIGS. 17A and 17B, on the workpiece upper surface, a titanium nitride film 209 to serve as a barrier layer is formed to a thickness of 10 nm, a P-doped amorphous silicon film 210n to serve as an n-layer of a rectifying element, pin diode, is formed to a thickness of 50 nm, a non-doped amorphous silicon film 210i to serve as an i-layer of the rectifying element is formed to a thickness of 10 nm, and a B-doped amorphous silicon film 210p to serve as a p-layer of the rectifying element is formed to a thickness of 50 nm.

Subsequently, on the workpiece upper surface, a substance serving as a nucleus for crystal growth of diodes (e.g., Ni) is formed at a density of $1 \times 10^{13}$ to $3 \times 10^{14}$ cm$^{-2}$ (not shown).

Next, over the substrate, a titanium nitride film 211 to serve as a lower electrode of a recording unit is formed to a thickness of 10 nm, a C film 212 to serve as a recording layer is formed to a thickness of 10 nm, a titanium nitride film 213 to serve as an upper electrode of the recording unit is formed to a thickness of 10 nm, and a tungsten film 214 to serve as a CMP stopper layer is formed to a thickness of 50 nm.

Next, by the lithography and reactive ion etching technique, the stacked films are collectively patterned in the X-axis and Y-axis direction. Thus, the cell unit assumes a columnar shape as shown in FIGS. 17A and 17B. In this method, the multilayer film of rectifying element 210/electrode layer 211/recording layer 212/electrode layer 213 does not need to be patterned collectively with word lines or bit lines. Hence, the thickness of the multilayer film processed in one processing step remains under the total thickness of the multilayer film of the barrier layer 209, rectifying element 210/electrode layer 211/recording layer 212/electrode layer 213, and the CMP stopper layer 214. Thus, the height of the processed pattern is restricted, and hence the pattern can avoid bending, collapsing and the like. This ensures more adequate performance and quality, and facilitates processing.

Next, as shown in FIGS. 18A and 18B, an interlayer dielectric film 234 is filled between the cell units processed into a columnar shape, and is planarized by CMP using the tungsten film 214 as a stopper.

Next, an interlayer dielectric film 235 is formed over the substrate. Subsequently, trenches serving as a template for bit lines 215 are formed in the interlayer dielectric film 235 by the lithography and reactive ion etching technique. Subsequently, a tungsten film 215 to serve as bit lines is formed to a thickness of 70 nm to completely fill the trenches. Subsequently, the workpiece upper surface is planarized by CMP. Thus, bit lines are formed.

Thus, two unit memory layers are formed. Subsequently, the unit memory layers can be stacked by repeating a similar procedure to form four unit memory layers.

Next, heat treatment is performed on the above workpiece. The heat treatment is performed illustratively in a diffusion furnace at 480-620° C. for several to several ten hours. This simultaneously crystallizes the amorphous layers constituting diodes in different layers. In this temperature region, B (boron) in the p-type semiconductor and P (phosphorus) in the n-type semiconductor constituting the diodes are hardly diffused, and hence the p-n junction profile (the impurity concentration profile in the vicinity of the p-n junction interface) is hardly varied.

Next, RTP (rapid thermal process) is used to perform activation annealing at 1000° C. for 5 seconds, for example. This simultaneously activates impurities constituting diodes in different layers, and the diode formation is completed. Alternatively, the activation annealing can be millisecond annealing (annealing on the order of millisecond) at 1000° C. or more using a laser or Xe flash lamp.

The above process results in fabricating a nonvolatile storage device 2Q according to this Practical example, which has uniform cell characteristics across the layers. The method similar to the foregoing can be repeated to fabricate a nonvolatile storage device including more unit memory layers.

In the foregoing, the recording layer is illustratively made of a C film. However, the recording layer can be made of any material which changes the resistance state in response to the voltage applied thereacross. For example, the recording layer can include at least one selected from the group consisting of C, NbO$_x$, Cr-doped SrTiO$_{3-x}$, Pr$_x$Ca$_y$MnO$_z$, ZrO$_x$, NiO$_x$, Ti-doped NiO$_x$, ZnO$_x$, TiO$_x$, TiO$_x$N$_y$, CuO$_x$, GdO$_x$, CuTe$_x$, HfO$_x$, ZnMn$_x$O$_y$, and ZnFe$_x$O$_y$, or at least one selected from the group consisting of chalcogenide-based GST (Ge$_x$Sb$_y$Te$_z$), doped GST such as N-doped GST and O-doped GST, Ge$_x$Sb$_y$, and In$_x$Ge$_y$Te$_z$, which change the resistance state by Joule's heat generated by the voltage applied thereacross. Furthermore, the recording layer can include a material in which two or more of these materials are mixed. Moreover, a multilayer structure including a plurality of layers made of these materials can be used.

In the foregoing, the electrode of the recording unit is illustratively made of titanium nitride. However, the electrode can be made of various materials which do not react with the resistance change material used in the recording unit to compromise its variable resistance. Specifically, for example, the electrode can include at least one selected from the group consisting of tungsten nitride, titanium nitride, titanium aluminum nitride, tantalum nitride, titanium nitride silicide, tantalum carbide, titanium silicide, tungsten silicide, cobalt silicide, nickel silicide, nickel platinum silicide, platinum, ruthenium, platinum-rhodium, and iridium. Furthermore, the electrode can include a material in which two or more of these materials are mixed. Moreover, a multilayer structure including a plurality of layers made of these materials can be used.

Furthermore, the substance serving as a nucleus for crystal growth (crystal nucleus) of diodes can be based on various materials described above with reference to Practical example 1. The method for forming amorphous silicon used for diodes and the method for impurity doping of the diode layer can be based on various methods described above with reference to Practical example 1.

The thicknesses of various films described above are illustrative only, and they can be variously modified.

As described above, this embodiment can provide a nonvolatile storage device having good operating characteristics and being easily processed, and a method for manufacturing the same.

Thus, in this embodiment, variations in memory cell characteristics can be suppressed even if the number of layered films is increased. Hence, this embodiment has an advantage of being able to produce a resistance change memory suitable for increased capacity.

The embodiment of the invention has been described with reference to examples. However, the invention is not limited to these examples. More specifically, those skilled in the art can suitably modify these examples, and such modifications are also encompassed within the scope of the invention as long as they fall within the spirit of the invention. For instance, the layout, material, condition, shape, size and the like of the components included in the above examples are not limited to those illustrated, but can be suitably modified.

Furthermore, the components included in the above embodiment can be combined with each other as long as technically feasible, and such combinations are also encompassed within the scope of the invention as long as they fall within the spirit of the invention.

Furthermore, those skilled in the art can suitably modify and implement the nonvolatile storage device and the method for manufacturing the same described above in the embodiment of the invention, and any nonvolatile storage device and method for manufacturing the same thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A method for manufacturing a nonvolatile storage device comprising:
    forming a multilayer structure comprising a plurality of unit memory layers vertically stacked one on another, wherein each unit memory layer comprises:
        a first interconnect aligned in a first direction;
        a second interconnect aligned in a second direction that is non-parallel to the first direction;
        a recording unit disposed between the first interconnect and the second interconnect and being capable of reversibly transitioning between a first state and a second state in response to a current supplied through the first interconnect and the second interconnect; and
        a rectifying element including an amorphous material layer disposed between the first interconnect and the recording unit and having at least one of p-type or n-type impurities; and
    wherein the unit memory layers are formed at a temperature lower than a temperature at which the amorphous material layer is substantially crystallized;
    simultaneously crystallizing the amorphous material layers in the unit memory layers; and
    simultaneously activating the impurities in the amorphous material layers used in the unit memory layers.

2. The method according to claim 1, wherein the rectifying element includes a diode selected from a Zener diode, a PN junction diode, a Schottky diode, and a pin diode.

3. The method according to claim 1, wherein the amorphous material layer is formed by at least one of sputtering, plasma chemical vapor deposition, low pressure chemical vapor deposition, or coating.

4. The method according to claim 3, wherein the amorphous material layer is formed by sputtering.

5. The method according to claim 1, wherein the activating the impurities is performed by a rapid thermal process.

6. The method according to claim 1, wherein the activating the impurities is performed using at least one of a laser and a Xe flash lamp.

7. The method according to claim 1, further comprising:
    forming a substance serving as a nucleus for crystal growth of the amorphous material.

8. The method according to claim 7, wherein the crystal nucleus is formed when the first interconnect is formed.

9. The method according to claim 7, wherein the crystal nucleus is formed by sputtering.

10. The method according to claim 7, wherein the crystal nucleus includes the same material as the first interconnect.

11. The method according to claim 7, wherein
    the recording unit includes:
        a first layer, a second layer and a recording layer interposed therebetween in the layering direction, and
    the crystal nucleus includes the same material as the first or second layer disposed between the rectifying element and the recording layer.

12. The method according to claim 7, wherein the crystal nucleus includes at least one element selected from the group consisting of Ni, Co, Pd, Pt, Cu, Ag, Au, In, Sn, Al, and Sb.

13. The method according to claim 12, wherein the crystal nucleus is formed from Ni at a density of $1\times10^{13}$ to $3\times10^{14}$ $cm^{-2}$.

14. The method according to claim 1, wherein a layer to serve as the recording unit, a film to serve as the rectifying element, and a layer to serve as the first or second interconnect are collectively patterned.

15. The method according to claim 1, wherein a layer to serve as the recording unit and a film to serve as the rectifying element are collectively patterned independent of processing of a layer to serve as the first or second interconnect.

* * * * *